(12) United States Patent
Uchida et al.

(10) Patent No.: US 6,628,562 B2
(45) Date of Patent: Sep. 30, 2003

(54) METHOD AND APPARATUS FOR HIGH-SPEED READ OPERATION IN SEMICONDUCTOR MEMORY

(75) Inventors: Toshiya Uchida, Kawasaki (JP); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/001,790

(22) Filed: Dec. 5, 2001

(65) Prior Publication Data

US 2002/0145934 A1 Oct. 10, 2002

(30) Foreign Application Priority Data

Apr. 9, 2001 (JP) .......................................... 2001-109901

(51) Int. Cl.[7] ................................................. G11C 8/00
(52) U.S. Cl. ............................ 365/230.03; 365/189.04; 365/220
(58) Field of Search ........................ 365/230.03, 189.04, 365/220; 711/168, 169

(56) References Cited

U.S. PATENT DOCUMENTS 5,926,827 A * 7/1999 Dell et al. ...................... 714/6
6,223,301 B1 * 4/2001 Santeler et al. ............. 714/757
6,304,992 B1 * 10/2001 Cypher ........................ 714/757

\* cited by examiner

*Primary Examiner*—Richard Elms
*Assistant Examiner*—Jung H. Hur
(74) *Attorney, Agent, or Firm*—Arent Fox Kintner Plotkin & Kahn

(57) ABSTRACT

Data is stored into a plurality of first memory blocks, and regeneration data for regenerating this data is stored into a second memory block. In a read operation, either a first operation for reading the data directly from a first memory block selected or a second operation for regenerating the data from the data stored in unselected first memory blocks and the regeneration data stored in the second memory block is performed. This makes it possible to perform an additional read operation on a first memory block during the read operation of this first memory block. Therefore, requests for read operations from exterior can be received at intervals shorter than read cycles. That is, the semiconductor memory can be operated at higher speed, with an improvement in data read rate.

22 Claims, 24 Drawing Sheets read operation read operation read operation read operation write operation

METHOD AND APPARATUS FOR HIGH-SPEED READ OPERATION IN SEMICONDUCTOR MEMORY

BACKGROUND OF THE INVENTION

1. Field of the Invention

The present invention relates to speeding up a semiconductor memory.

2. Description of the Related Art

FIG. 1 shows a memory core of a semiconductor memory such as a DRAM. A memory core (also referred to as a block or a bank) has a plurality of memory cells MC which are arranged in a matrix. These memory cells MC are respectively connected to word lines WL0, WL1, WL2, . . . which are laid in the horizontal direction of the diagram and bit line pairs BL0-/BL0, BL1-/BL1, . . . which are laid in the vertical direction of the diagram. The bit line pairs BL0-/BL0, BL1-/BL1, . . . are connected to respective sense amplifiers SA.

In a read operation of the semiconductor memory of this type, a word line is selected to turn on the transfer transistors of memory cells MC so that the data of the memory cells MC is read to bit line pairs. The read data is amplified by the sense amplifiers SA and output to exterior. Then, the bit line pairs are precharged (equalized) to complete the read operation.

For example, the pieces of data read from the memory cells MC that are shown with thick frames in the diagram are transmitted through the bit line pair BL1,/BL1 to a sense amplifier SA. That is, the bit line pair BL1,/BL1 is shared among these memory cells MC. In this example, the memory cells MC that are connected to the bit line pair BL1,/BL1 retain "0 data," "1 data," "0 data," and "0 data," starting from the top in the diagram.

FIG. 2 shows read operations of the DRAM described above. When the word line WL0 shown in FIG. 1 is selected, data is read to bit line BL1 from the memory cell MC connected to the word line WL0. This lowers the voltage of the bit line BL1 (FIG. 2(a)). Then, the sense amplifier SA operates to amplify the voltage difference in the bit line pair BL1,/BL1 (FIG. 2(b)). After the read of "0 data," the bit line pair BL1,/BL1 is precharged to complete the read cycle (FIG. 2(c)).

If the word line WL1 is selected during the selection of the word line WL0 data is read to the bit line BL1 from the memory cell MC that retains "1 data" (FIG. 2(d)). Here, since the voltage of the bit line BL1 has been amplified to low level, a data crash occurs in the memory cell MC that retains "1 data." If data is read from the memory cells MC that are connected to the bit line /BL1 and retain "0 data," a data crash also occurs in these memory cells MC (FIG. 2(e)).

As described above, the simultaneous activation of a plurality of word lines within a memory core causes a data crash. On this account, it has been impossible to perform read operations on a plurality of memory cells MC that are connected to an identical bit line, at intervals shorter than a cycle time. In other words, the interval of requests for read operations on a single memory core has had to be greater than or equal to the read cycle (cycle time).

The foregoing problem is an obstacle to the high-speed operation of semiconductor memories, hindering improvements in data read rate. In particular, because of requiring a precharging time and being often provided with bit lines of greater lengths for the sake of a reduction in memory core area, DRAMs have longer cycle times as compared to SRAMs and the like. Thus, the foregoing problem is of seriousness.

SUMMARY OF THE INVENTION

It is an object of the present invention to provide a semiconductor memory capable of operating at high speed for improvement in data read rate.

According to one of the aspects of the present invention, data is stored in a plurality of first memory blocks, and regeneration data for generating the data stored in the first memory blocks is stored in a second memory block. In a read operation, either a first operation or a second operation is performed to read the data. In the first operation, data is read directly from a selected first memory block among the plurality of first memory blocks. In the second operation, the selected first memory block does not operate, and data is regenerated from the data stored in unselected first memory blocks and the regeneration data stored in the second memory block.

Thus, performing either the first operations or the second operations in parallel allows the data in a first memory block to be read while this first memory block is reading data. Accordingly, requests for the read operations made from the exterior of the memory can be received at an interval shorter than a read cycle neccesary for the first memory blocks to perform a signle read operation. As a result, the semiconductor can operate at high speed, with an improvement in data read rate.

In a write operation, for example, data is written to a selected first memory block among the plurality of first memory blocks. At the same time, regeneration data for regenerating the data stored in the first memory block is written to the second memory block.

Acccording to another aspect of the present invention, in the second memory block a parity bit of the first memory blocks is stored as the regeneration data. Since the regeneration data for regenerating each memory cell of the first memory blocks can be configured in a single bit, it is possible to minimize the storage capacity of the second memory block. Therefore, the second memory block can be shrunk in layout size, with a reduction in the chip size of the semiconductor memory.

According to another aspect of the present invention, the semiconductor memory includes a plurality of memory block groups each composed of a predetermined number (except "1") of first memory blocks among the plurality of first memory blocks and any of a plurality of second memory blocks. Each of the first memory blocks belongs to a plurality of memory block groups. A plurality of the first memory blocks belonging to one of the memory block groups do not belong to the other memory block groups together.

The memory block groups can be configured easily by, for example, arranging the first memory blocks in matrix and assigning the second memory blocks corresponding to the plurality of first memory blocks which align in a horizontal direction and a vertical direction, respectively (memory block groups of two-dimensional configuration). Here, the memory block groups are identified by an address signal. The bits of addresses of the first memory blocks belonging to one of the memory block groups partly have the same value. Since the first and second memory blocks can be arranged by simple rules, the layout design is fascilitated. This can prevent complicating the wiring which interconnects the first and second memory blocks, and reduce the layout size necessary for the wiring. As a result, the semiconductor memory can be made smaller in chip size. Besides, a reduction in the wiring length mentioned above makes it possible to operate the first and second memory blocks at higher speed.

Since requests for the read operations from the exterior of the memory are received at an interval shorter than the read cycle of the first memory blocks, and at least either the first operations or the second operations are performed in parallel on a plurality of memory block groups, it is possible to reduce the interval at which the requests are received (cycle time).

According to another aspect of the present invention, the semiconductor memory includes a plurality of flag circuits and a block selecting circuit. The flag circuits indicate the operating states of the first and second memory blocks, respectively. Since the block selecting circuit has only to select at least either the first or second memory blocks in accordance with the outputs of the flag circuits, and an address signal, it can be made smaller in circuit scale. The flag circuits, for example, change the operating states to "operative" in response to the output of memory block selecting signals corresponding to the flag circuits, the block selecting signals being output from the block selecting circuit. They change the operating states to "inoperative" a predetermined time after the output of the corresponding memory block selecting signals.

According to another aspect of the present invention, the semiconductor memory, in performing the read operations in succession, performs only the second operations sequentially to read the data. This eliminates the need for making a decision as to which operation, the first or second, should be performed so that the control circuit can be simply configured. As a result, the semiconductor memory can be made smaller in chip size, with a reduction in fabrication cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 21 is an explanatory diagram showing a fourth embodiment of the present invention;

DETAILED DESCRIPTION OF THE PREFERRED EMBODIMENTS

Hereinafter, embodiments of the present invention will be described with reference to the drawings.

FIG. 3 shows the basic principles of the present invention.

A semiconductor memory has first memory blocks M0, M1, M2, and M3 for storing data written from the exterior of the memory, a second memory block H0 for storing regeneration data for regenerating data stored in the first memory blocks M0–M3, and a read control circuit 10. The first memory blocks M0–M3 are identified by two bits of address signal A0 and A1 (block selecting address). The memory cells in the first memory blocks M0–M3 are identified by a lower address. The second memory block H0 has memory cells corresponding to the memory cells in the first memory block M0 (or M1–M3). Regeneration data such as the parity bits of the first memory blocks M0–M3 is written to the second memory block H0. The first memory blocks M0–M3 and the second memory block H0 can operate independent of each other.

Figure 1:
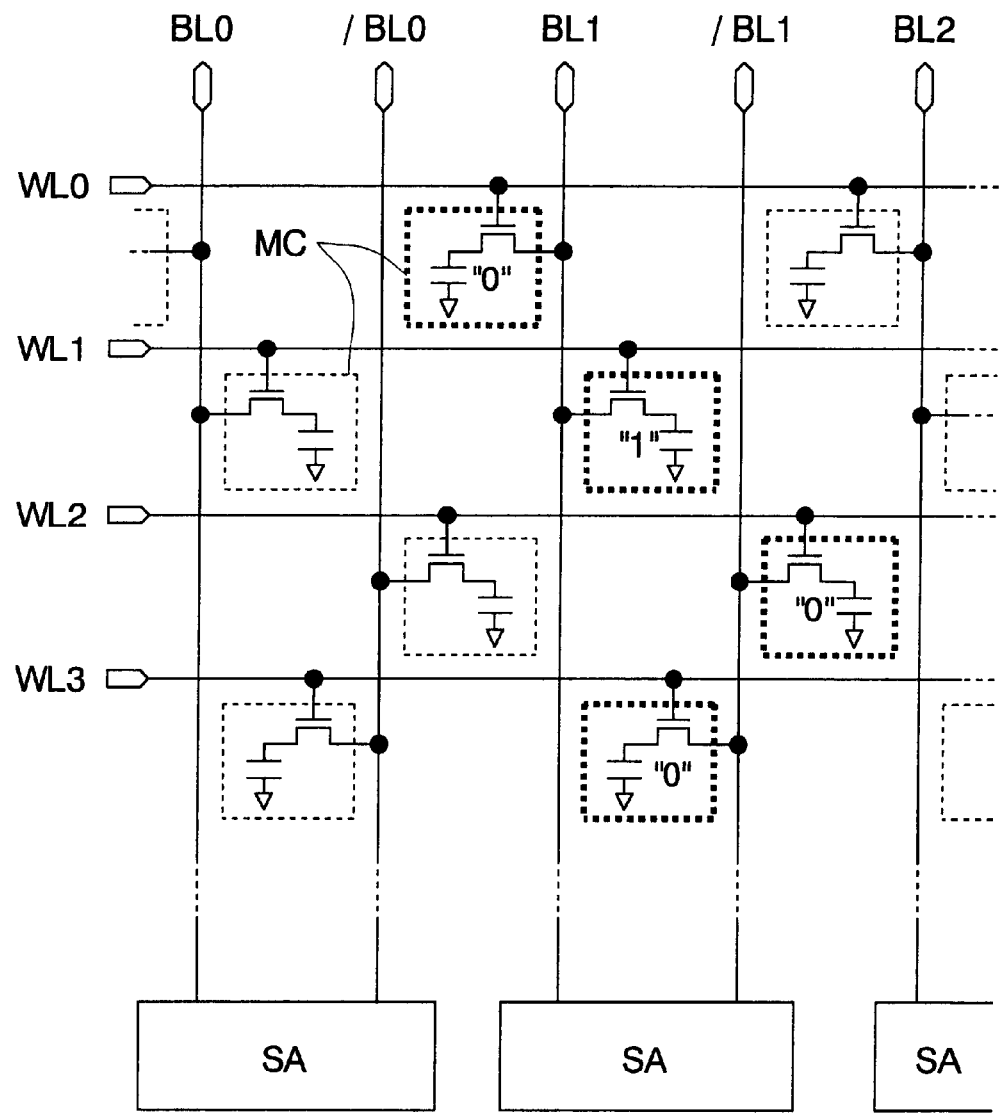
FIG. 1 is a circuit diagram showing a memory core of a conventional semiconductor memory.
Figure 2:
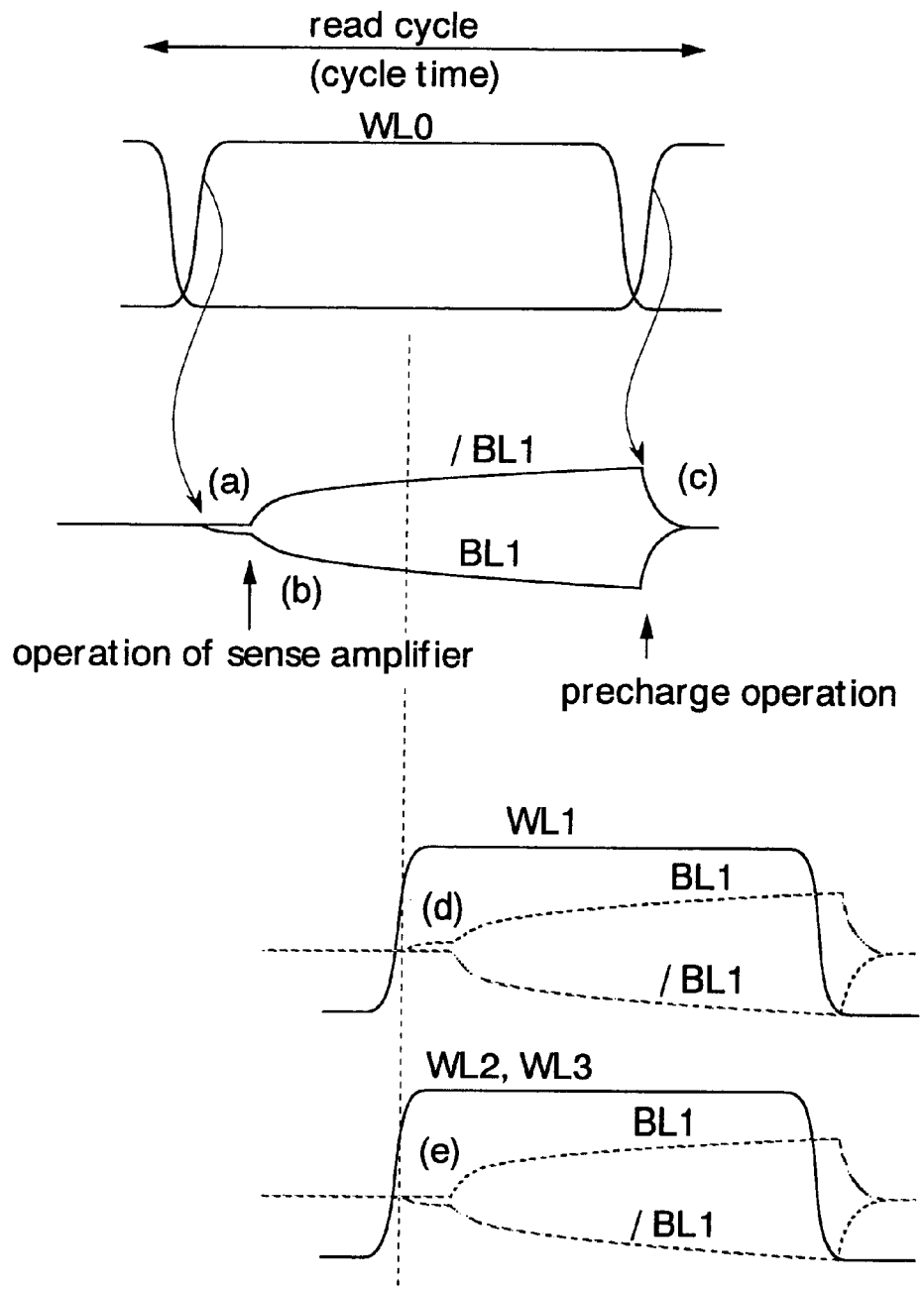
FIG. 2 is a timing chart showing a problem in conventional read operations.
Figure 3C:
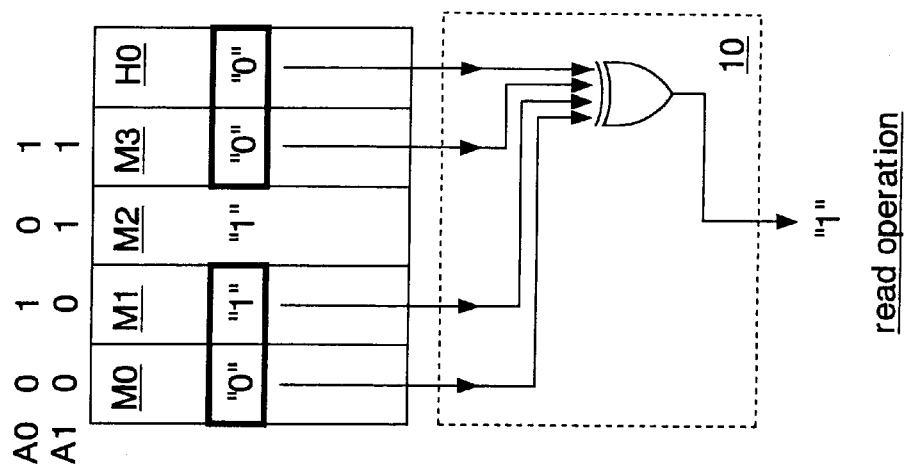
FIGS. 3A through 3C are explanatory diagrams showing the basic principles of the present invention.
Figure 3B:
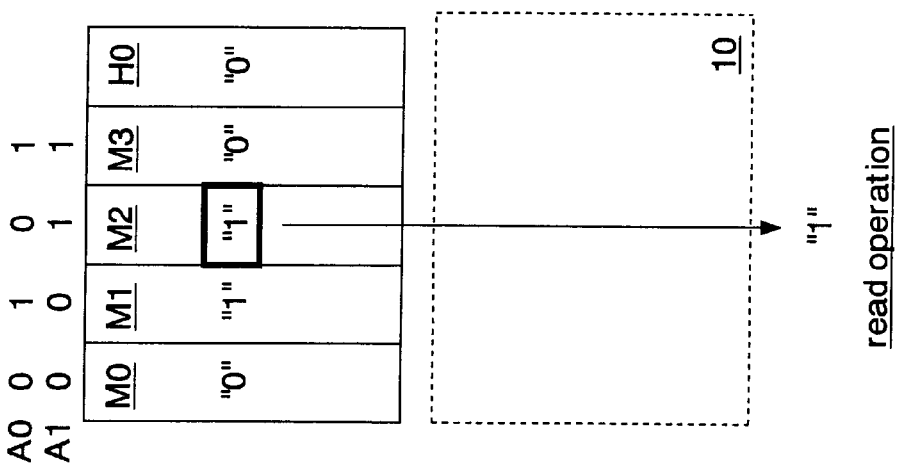
Figure 3A:
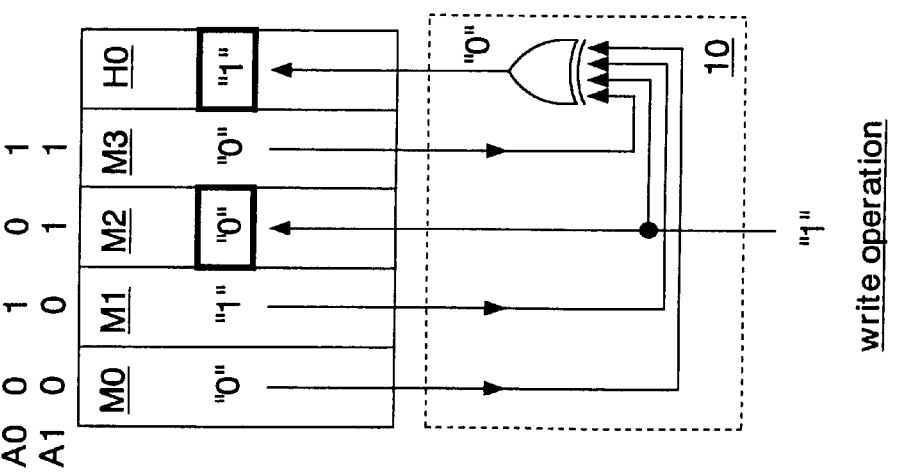

FIG. 3A shows a write operation in which data is written to a predetermined region of the first memory block M2 that is indicated with a thick frame. Before the write operation, the thick-framed region of the first memory block M2 contains "0 data." The first memory blocks M0, M1, and M3 corresponding to the thick-framed region contain "0 data," "1 data," and "0 data," respectively. Corresponding to the thick-framed region, the second memory block H0 contains the even parity bit of the data stored in the first memory block M0–M3 ("1 data," in this example). That is, a number of the "1 data" of the first memory blocks M0–M3 and a number of the "1 data " of the second memory block H0 sum into an even number.

In the write operation, the read control circuit 10 writes "1 data" to the thick-framed region of the first memory block M2. Next, the read control circuit 10 reads the data from the first memory blocks M0–M3 and writes the even parity bit of these pieces of data to the second memory block H0. By the write operation, the data shown in FIG. 3B is stored in the first memory blocks M0–M3 and the second memory block H0.

Incidentally, in the write operation, the read control circuit 10 may begin by reading "0 data" stored in the first memory block M2 and "1 data" stored in the second memory block H0, and write the inverted data to the second memory block H0 only if the data to be written newly is different from the data stored in the first memory block M2.

For a read operation, the read control circuit 10 performs either the first operation shown in FIG. 3B or the second operation shown in FIG. 3C. In the first operation, the read control circuit 10 reads "1 data" directly from the first memory block M2 which is selected in accordance with the address signal. In the second operation, the read control circuit 10 do not operate the selected first memory block M2, but operate the unselected first memory blocks M0, M1, M3 and the second memory block H0. Then, the read control circuit 10 reads "0 data," "1 data," "0 data," and "0 data" from the regions shown with the thick frames in FIG. 3C, respectively, and outputs the parity bit of these pieces of data as the data stored in the first memory block M2. That is, in the second operation, the data stored in the first memory block M2 is regenerated without the operation of the selected first memory block M2.

Figure 4:
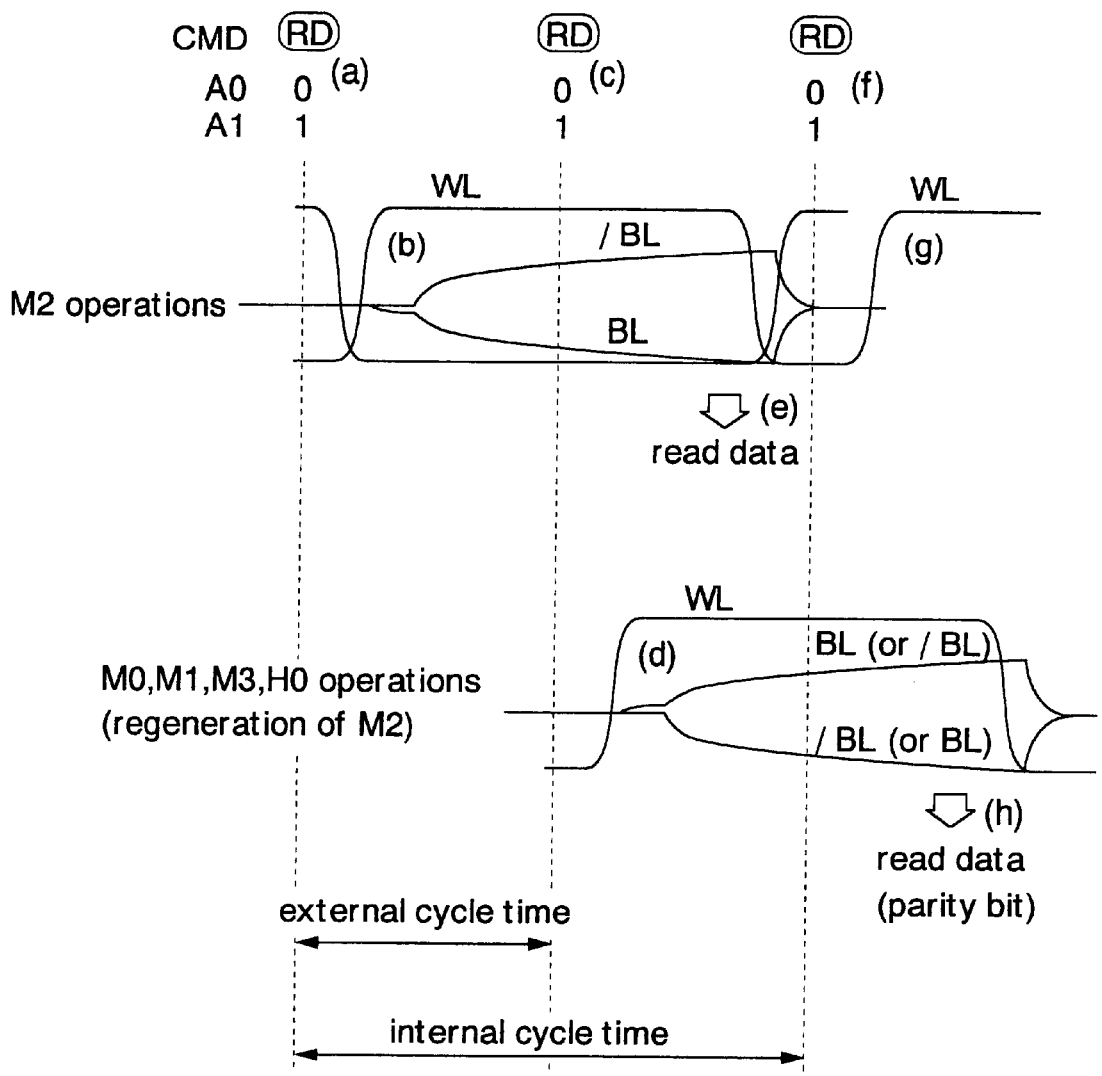
FIG. 4 is a timing chart showing read operations of the semiconductor memory of FIG. 3.

FIG. 4 shows the timing of read operations in the semiconductor memory described above. In this example, read commands RD for the first memory block M2 (A0=0, A1=1) are supplied in succession. The interval of supply of read commands RD (external cycle time, which is a catalog specification of the semiconductor memory) is a half of the cycle time necessary for a read operation of the first memory blocks M0–M3 and the second memory block H0 (internal cycle time).

Initially, a read command RD and an address signal (A0=0, A1=1, and a lower address) are supplied from the exterior of the memory (FIG. 4(a)). The read control circuit 10 selects a predetermined word line W1 in the first memory block M2 so as to read data directly from the first memory block M2 (FIG. 4(b)). Incidentally, the waveform almost reverse to the word line WL in phase is of a precharging signal. Bit lines BL and /BL are precharged when the precharging signal is at high level.

While the first memory block M2 is amplifying the data on its bit lines BL and /BL, the next read command RD for the first memory block M2 is supplied (FIG. 4(c)). Since the first memory block M2 is in operation, the read control circuit 10 starts the operation of the first memory blocks M0, M1, M3 and the second memory block H0 (FIG. 4(d)). During the operation of the first memory blocks M0, M1, M3 and the second memory block H0, the read data from the first memory block M2 is output (FIG. 4(e)).

While the first memory blocks M0, M1, M3 and the second memory block H0 are amplifying data on their bit lines BL and /BL, the next read command RD is supplied (FIG. 4(f)). Since the first memory block M2 is not in operation, the read control circuit 10 starts the operation of the first memory block M2 (FIG. 4(g)). During the operation of the first memory block M2, the read control circuit 10 outputs the parity bit of the data read from the first memory blocks M0, M1, M3 and the second memory block H0 as the read data of the first memory block M2 (FIG. 4(h)).

In this way, according to the present invention, even if the first memory block M2 is in operation, the other first memory blocks M0, M1, M3 and the second memory block H0 can be used to read out the data of the first memory block M2 indirectly. This makes it possible to receive the next read request to the first memory block M2 during the operation of the first memory block M2. As a result, the external cycle time, or the interval of supply of read commands RD from the exterior of the memory, can be reduced to half to make the data read rate of the semiconductor memory twice as compared to heretofore. That is, the semiconductor memory can be operated at higher speed.

Figure 5:
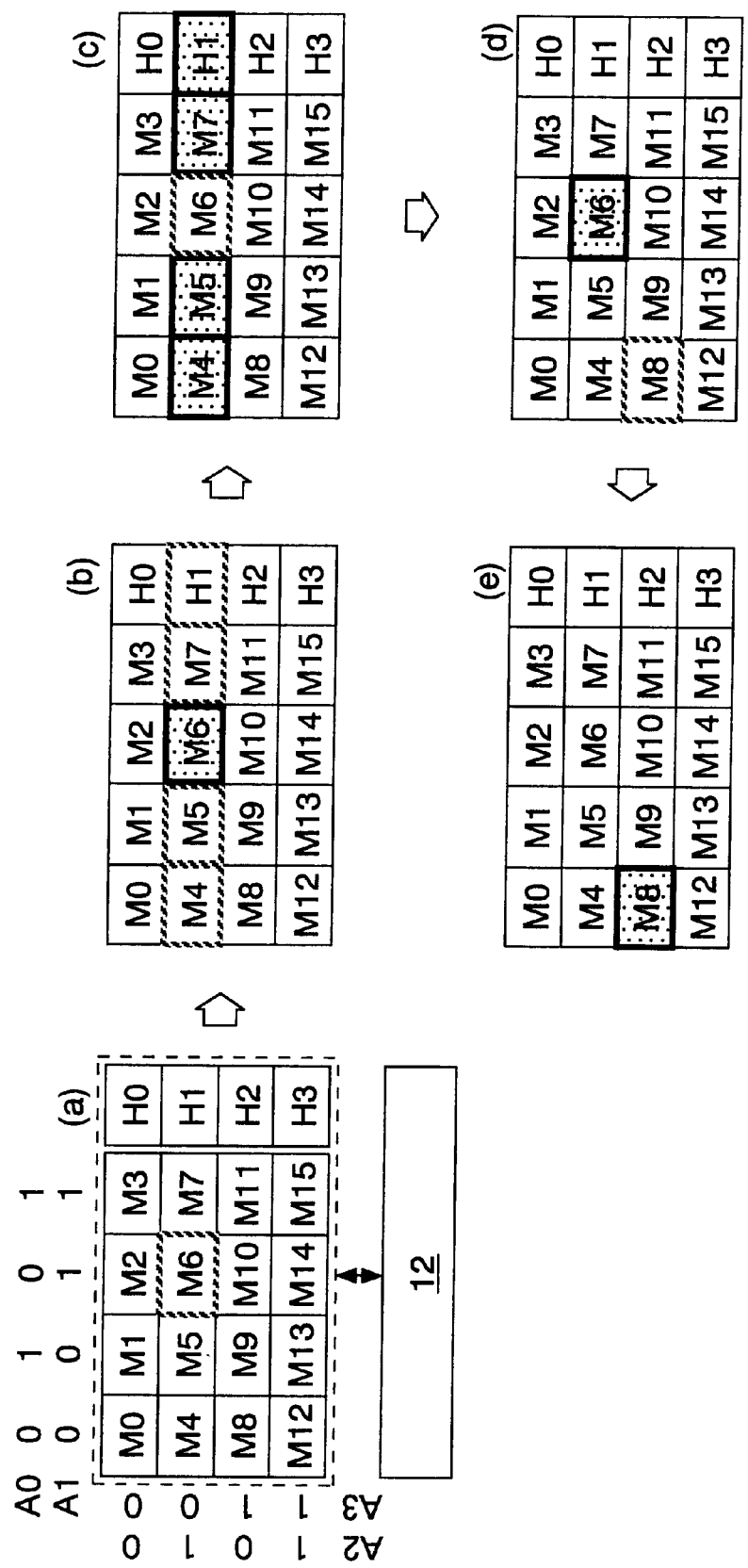
FIG. 5 is an explanatory diagram showing a first embodiment of the present invention.

FIG. 5 shows a first embodiment of the present invention. The same elements as those of the basic principles described above will be designated by identical reference numbers or symbols. This semiconductor memory is formed as a clock synchronous DRAM (SDRAM). The SDRAM has sixteen first memory blocks M0–M15 which are arranged in a 4×4 matrix, four second memory blocks H0–H3, and a read control circuit 12. Aside from those shown in the diagram, the SDRAM also includes input circuits for address, clock, and command signals, an input/output circuit for a data signal, a command decoder, a control circuit for performing read, write, and refresh operations, and so on. Hereinafter, the first and second memory blocks may also be referred to simply as blocks. The read control circuit 12 has almost the same function as that of the read control circuit 10 of FIG. 3.

The blocks M0–M15 are identified by four bits of address signal A0–A3 (block selecting address) to be supplied from the exterior of the memory. The blocks M0–M15 each have a plurality of memory cells individually connected to word lines and bit lines, and are capable of operating independently. In a read operation, the blocks M0–M15 select a word line in accordance with an upper address signal, and output data from the memory cells connected to this word line to bit lines. The data output to the bit lines is amplified by sense amplifiers. Of the pieces of data amplified, one corresponding to a lower address signal is then output to exterior as read data.

The second memory blocks H0–H3 are formed for the first memory blocks M0–3, M4–7, M8–11, and M12–15, respectively. Each of the memory cells in the second memory blocks H0–H3 retains, as regeneration data, the parity bit of data retained in its corresponding four first memory blocks. Regeneration data may be a single bit. Therefore, the second memory block H0–H3 may have the same storage capacity as that of the first memory blocks M0–M15. Since the storage capacity of the second memory blocks H0–H3 can be minimized, it is possible to reduce the layout size of the second memory blocks H0–H3.

Figure 6:
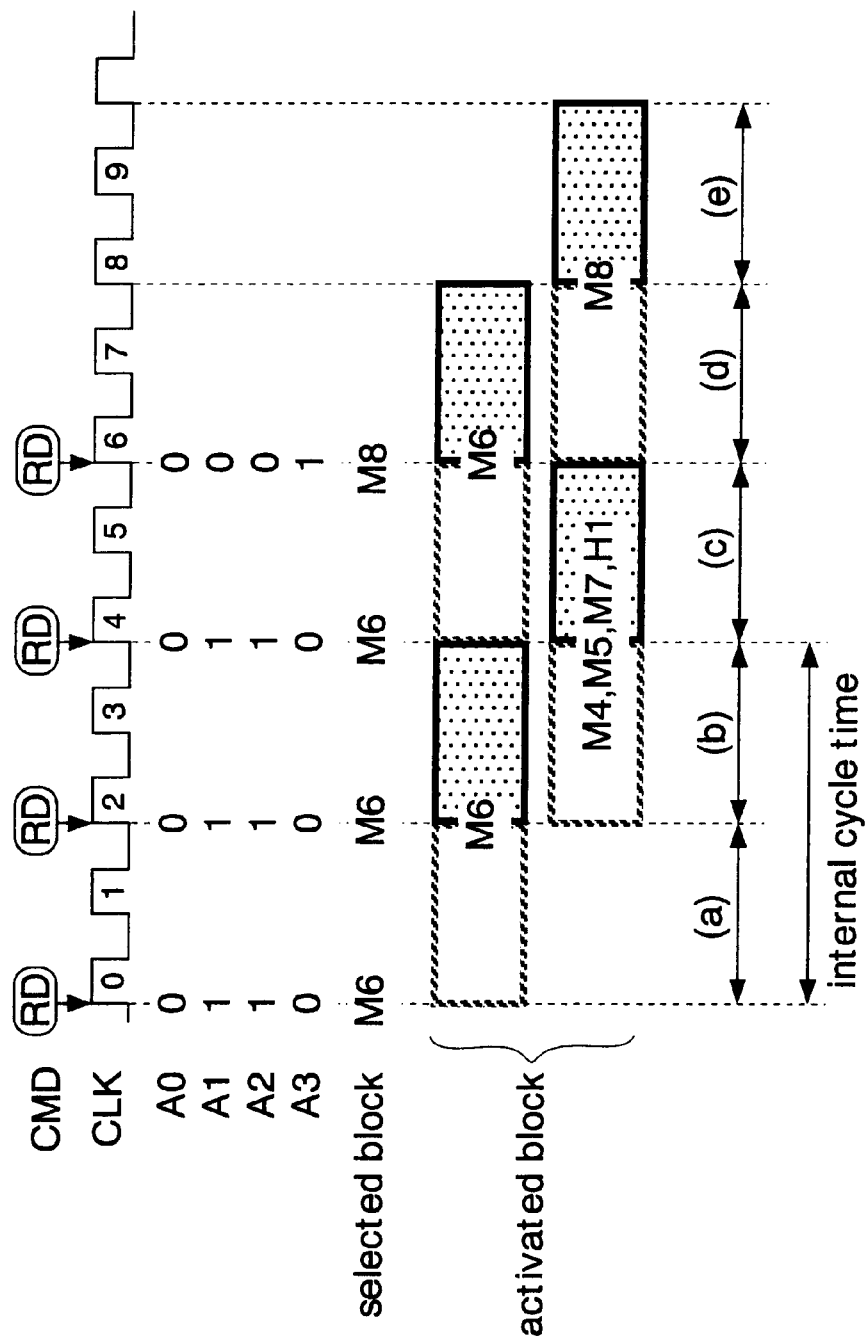
FIG. 6 is a timing chart showing read operations of the SDRAM of FIG. 5.

Next, referring to FIGS. 5 and 6, description will be given of read operations in the SDRAM described above. In this example, three successive read operations are performed on the block M6 before a single read operation is performed on the block M8. FIGS. 5(a), (b), (c), (d), and (e) correspond to FIGS. 6(a), (b), (c), (d), and (e), respectively, showing two clock cycles of operation. In FIGS. 5 and 6, thick broken lines indicate that those blocks are performing the first halves of the read operations. Shades indicate that those blocks are performing the second halves of the read operations. The first half of a read operation corresponds to from the selection of a word line to the start of operation of a sense amplifier. The second half of a read operation corresponds to from the operation of a sense amplifier to the output of read data and the precharge of bit lines. The read operation of each block (internal cycle time) requires four clock cycles (first half+second half), as shown in FIG. 6.

(a) Initially, in synchronization with a clock signal CLK, the SDRAM receives a read command RD and an address signal for accessing the block M6. The read control circuit 12 selects the block M6 which is shown with thick broken lines, and starts a first operation in the same manner as in the basic principles described above.

(b) In synchronization with the second clock signal CLK, the SDRAM receives a read command RD and an address signal for accessing the block M6. The read control circuit 12 selects the blocks M4, M5, M7, and H1 which are shown with thick broken lines in FIG. 5, and starts a second operation in the same manner as in the basic principles described above. The shaded block M6 performs the second half of the read operation to output read data.

(c) Next, in synchronization with the fourth clock signal CLK, a read command RD and an address signal for accessing the block M6 are supplied. Since the operation of the block M6 has been completed, the read control circuit 12 reselects the block M6 which is shown with thick broken lines, and starts a first operation. The shaded blocks M4, M5, M7, and H1 perform the second half of the read operation to output read data.

(d) Next, in synchronization with the sixth clock signal CLK, a read command RD and an address signal for accessing the block M8 are supplied. Since the block M8 is not in operation, the read control circuit 12 selects the block M8 which is shown with thick broken lines, and starts a first operation. The shaded block M6 performs the second half of the read operation to output read data.

(e) Subsequently, the second half of the read operation of the block M8 is performed in synchronization with the eighth and ninth clock signals CLK, outputting read data. As has been described, the present embodiment can offer the same effects as those of the basic principles described above. Moreover, in this embodiment, either the first operation for reading data directly from a first memory block selected or the second operation for regenerating data from the data stored in unselected first memory blocks and regeneration data stored in a second memory block is performed in a read operation. Therefore, requests for read operations can be received at intervals shorter than the read cycles. That is, the interval at which read commands are received (cycle time) can be made shorter than heretofore. As a result, the SDRAM can be operated at higher speed, with an improvement in data read rate.

The second memory blocks H0–H3 contain the parity bits of the first memory blocks M0–M15 as the regeneration data. Since the regeneration data for regenerating each memory cell in the first memory blocks M0–M15 may be a single bit, the second memory block H0–H3 can be minimized in storage capacity. Therefore, the second memory blocks H0–H3 can be made smaller in layout size, with a reduction in the chip size of the SDRAM.

Figure 7:
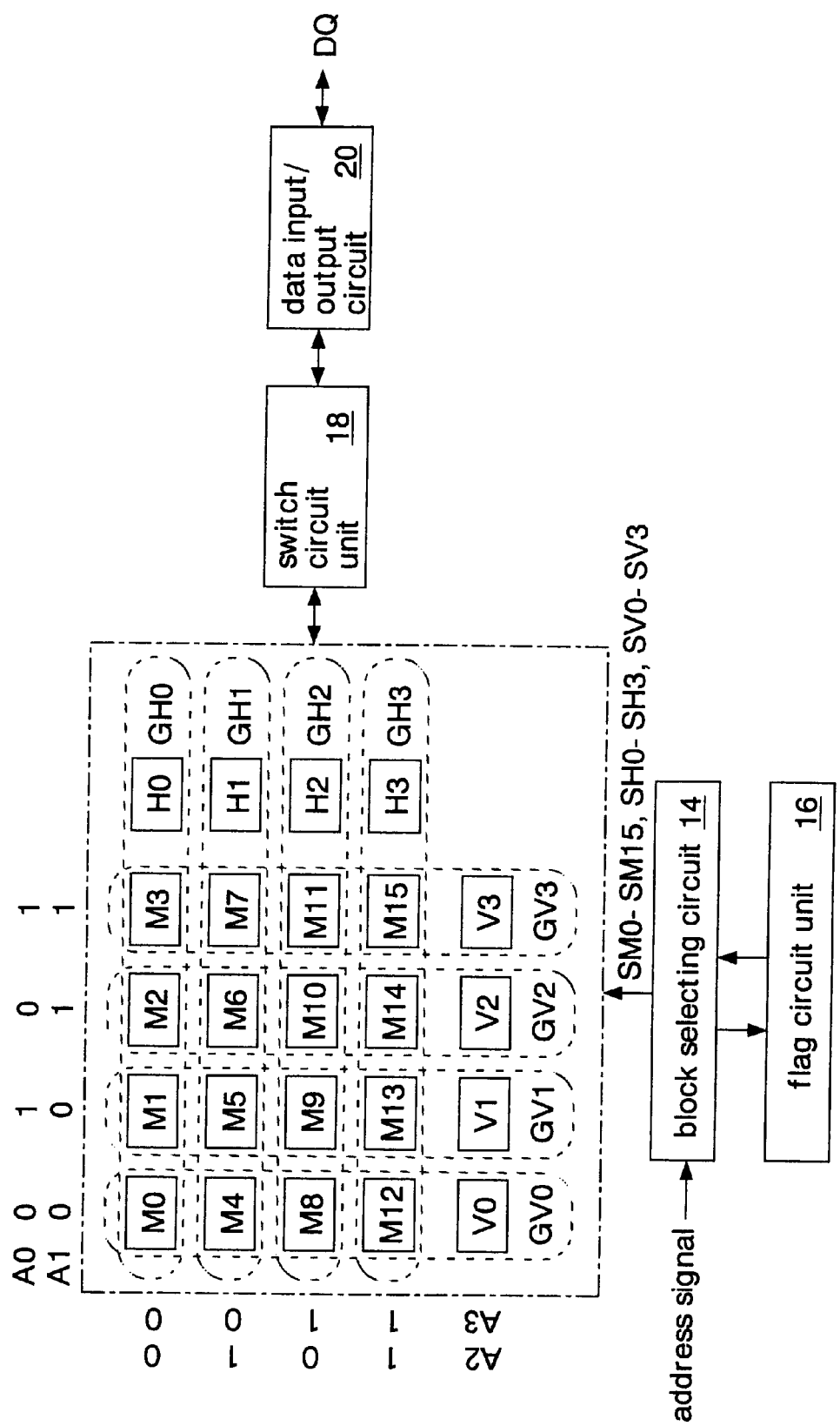
FIG. 7 is a block diagram showing a second embodiment of the present invention.

FIG. 7 shows a second embodiment of the present invention. The same elements as those of the basic principles and the first embodiment described above will be designated by identical reference numbers or symbols. This semiconductor memory is formed as a clock synchronous DRAM (SDRAM).

The SDRAM has sixteen first memory blocks M0–M15 which are arranged in a 4×4 matrix, eight second memory blocks H0–H3 and V0–V3, a block selecting circuit 14, a flag circuit unit 16, a switch circuit unit 18, and a data input/output circuit 20. The block selecting circuit 14, the flag circuit unit 16, the switch circuit unit 18, and the data input/output circuit 20 also operate as a read control circuit. These circuits perform the first operation or the second operation in the same manner as in the basic principles described above. The storage capacity of each first memory block M0–M15 and the storage capacity of each second memory block H0–H3, V0–V3 are identical. Aside from those shown in the diagram, the SDRAM also includes input circuits for address, clock, and command signals, a command decoder, a control circuit for performing read, write, and refresh operations, and so on.

The blocks M0–M15 are identified by four bits of address signal A0–A3 (block selecting address) to be supplied from the exterior of the memory. The second memory blocks H0–H3 are formed for the first memory blocks M0–3, M4–7, M8–11, and M12–15, respectively. The second memory blocks V0–V3 are formed for the first memory blocks (M0, M4, M8, M12), (M1, M5, M9, M14), (M2, M6, M10, M14), and (M3, M7, M11, M15), respectively.

In this embodiment, eight memory block groups GH0, GH1, GH2, GH3, GV0, GV1, GV2, and GV3 each are composed of four first memory blocks aligning in a horizontal direction or a vertical direction of the diagram and a single second memory block. That is, each signle first memory block is included in two memory block groups that extend in two directions (memory block groups of two-dimensional configuration). The memory block groups GH0, GH1, GH2, and GH3 are identified by upper two bits A2 and A3 out of the address signal A0–A3. The memory block groups GV0, GV1, GV2, and GV3 are identified by lower two bits A0 and A1 out of the address signal A0–A3. In other words, each single first memory block belongs to two memory block groups. For example, the first memory block M0 belongs to the memory block group GH0 which consists of the blocks M0, M1, M2, M3, and H0, and the memory block group GV0 which consists of the blocks M0, M4, M8, M12, and V0.

The first memory blocks belonging to one memory block group and those belonging to another memory block group do not coincide with each other mostly. For example, a plurality of blocks out of the blocks M0, M1, M2, and M3 in the memory block group GH0 never belong to another memory block together. Each of the memory cells in the second memory blocks H0–H3 and V0–V3 retains the parity bit of data retained in the four first memory blocks in its memory block group.

The block selecting circuit 14 receives the address signal from the exterior of the memory and information from the flag circuit unit 16, and outputs block selecting signals SM0–SM15, SH0–SH3, and SV0–SV3 to the first and second memory blocks. The flag circuit unit 16 sets or resets flag circuits (to be described later) for indicating the operating states of the first and second memory blocks, in accordance with control signals from the block selecting circuit 14.

The switch circuit unit 18 transmits data output from the first and second memory blocks to the data input/output circuit 20, transmits parity data from the first memory blocks to the second memory blocks, and transmits data output from the data input/output circuit 20 to the first and second memory blocks.

The data input/output circuit 20 supplies a data signal DQ (write data) from exterior to the switch circuit unit 18, and outputs read data from the switch circuit unit 18 to exterior as a data signal DQ.

Figure 8:
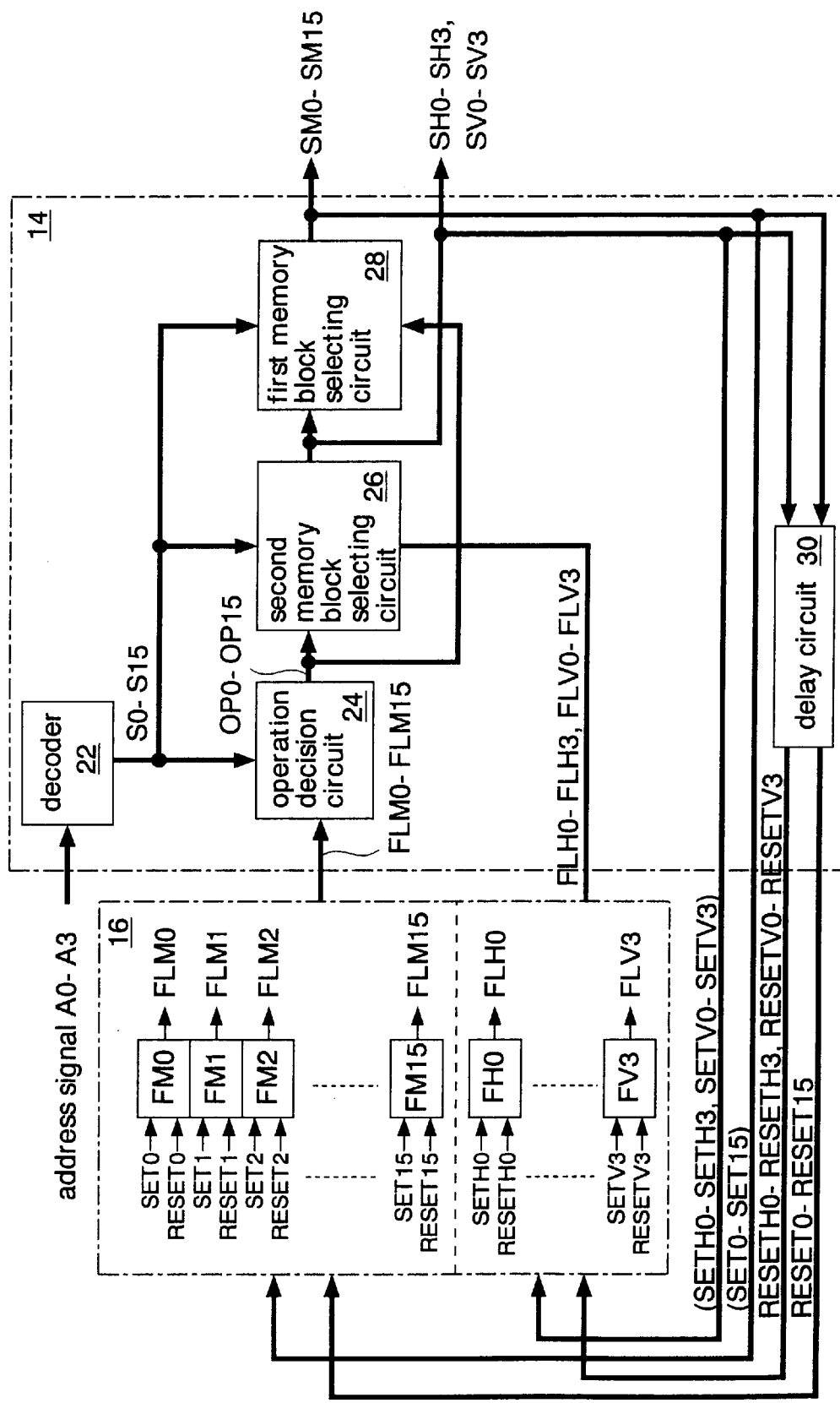
FIG. 8 is a block diagram showing the details of the flag circuit unit and the block selecting circuit of FIG. 7.

FIG. 8 shows the details of the flag circuit unit 16 and the block selecting circuit 14. The flag circuit unit 16 has flag circuits FM0–FM15 which correspond to the first memory blocks M0–M15, respectively, and flag circuits FH0–FH3 and FV0–FV3 which correspond to the second memory blocks H0–H3 and V0–V3, respectively. The flag circuits FM0–FM15 set flag signals FLM0–FLM15 upon receiving set signals SET0–SET15, respectively. They reset the flag signals FLM0–FLM15 upon receiving reset signals RESET0–RESET15, respectively. The flag circuits FH0–FH3 and FV0–FV3 set flag signals FLH0–FLH3 and FLV0–FLV3 upon receiving set signals SETH0–SETH3 and SETV0–SETV3, respectively. They reset the flag signals FLH0–FLH3 and FLV0–FLV3 upon receiving reset signals RESETH–RESETH3 and RESETV0–RESETV3, respectively.

The block selecting circuit 14 has a decoder 22, an operation decision circuit 24, a second memory block selecting circuit 26, a first memory block selecting circuit 28, and a delay circuit 30. The decoder 22 decodes the address signal A0–A3 to output any of select signals S0–S15 for selecting the first memory blocks M0–M15.

The operation decision circuit 24 receives the select signals S0–S15 and the flag signals FLM0–FLM15, and outputs operation signals OP0–OP15. The operation decision circuit 24 decides whether or not the first memory block corresponding to a select signal activated is operable. For example, the operation decision circuit 24 receives the activation of the select signal S0, activates the operation signal OP0 when the flag signal FLM0 corresponding to the select signal S0 is set, and inactivates the operation signal OP0 when the flag signal FLM0 is reset. Similarly, the operation decision circuit 24 receives the activation of the select signal S6, activates the operation signal OP6 when the corresponding flag signal FLM6 is set, and inactivates the operation signal OP6 when the flag signal FLM6 is reset.

The second memory block selecting circuit 26 receives the select signals S0–15 and the operation signals OP0–OP15, and outputs the block selecting signals SH0–SH3 and SV0–SV3 for selecting the second memory blocks H0–H3 and V0–V3. The block selecting signals SH0–SH3 and SV0–SV3 are output to the flag circuits FH0–FH3 and FV0–FV3 of the flag circuit unit 18 as the set signals SETH0–SETH3 and SETV0–SETV3, respectively. The second memory block selecting circuit 26 receives the inactivation of the operation signals OP0–OP15 to inactivate the block selecting signals SH0–SH3 and SV0–SV3. The second memory block selecting circuit 26 receives the activation of any of the operation signals OP0–OP15 to inactivate any of the block selecting signals SH0–SH3 and SV0–SV3. For example, when the select signal S6 is activated while the block M6 is in operation (the operation signal OP6 is activated), the block selecting signal SH1 (or SV2) for selecting the memory block group GH1 (or GV2) that contains the block M6 is activated.

The first memory block selecting circuit 28 receives the select signals S0–S15, the block selecting signals SH0–SH3, SV0–SV3, and the operation signals OP0–OP15, and outputs the block selecting signals SM0–SM15 for selecting the first memory blocks M0–M15. The block selecting signals SM0–SM15 are output to the flag circuits FM0–FM15 of the flag circuit unit 18 as the set signals SET0–SET15, respectively. The first memory block selecting circuit 28, when the operation signals OP0–OP15 are inactivated, outputs a selected select signal as the block selecting signal. For example, if the select signal S6 is activated while the block M6 is not in operation (the operation signal OP6 is inactivated), then the block selecting signal SM6 is activated. The exclusive activation of the block selecting signal SM6 effects a first operation on the block M6.

When any of the operation signals OP0–OP15 is activated, the first memory block selecting circuit 28 activates the block selecting signals for the first memory blocks in a memory block group that includes the first memory block corresponding to the activated operation signal, excepting the one corresponding to this operation signal. For example, when the first memory block selecting circuit 28 receives the activation of the select signal S6 and the activation of the block selecting signal SH1 while the block M6 is in operation (the operation signal OP6 is activated), it activates the block selecting signals SM4, SM5, and SM7 which correspond to the blocks M4, M5, and M7 of the memory block group GH1. The activation of the block selecting signals SM4, SM5, SM7, and SH1 effects a second operation on the block M6.

The delay circuit 30 outputs the reset signals RESET0–RESET15, RESETH0–RESETH3, and RESETV0–RESETV3 which are the block selecting signals SM0–SM15, SH0–SH3, and SV0–SV3 delayed by a predetermined time. The reset signals RESET0–RESET15, RESETH0–RESETH3, and RESETV0–RESETV3 are output to the flag circuits FM0–FM15, FH0–FH3, and FV0–FV3 of the flag circuit unit 18, respectively. The delay time of the delay circuit 30 is set in accordance with the actual operating times of the first and second memory blocks. That is, the reset signals RESET0–RESET15, RESETH0–RESETH3, and RESETV0–RESETV3 are output in response to the completion of the operations of the first and second memory blocks.

Figure 9:
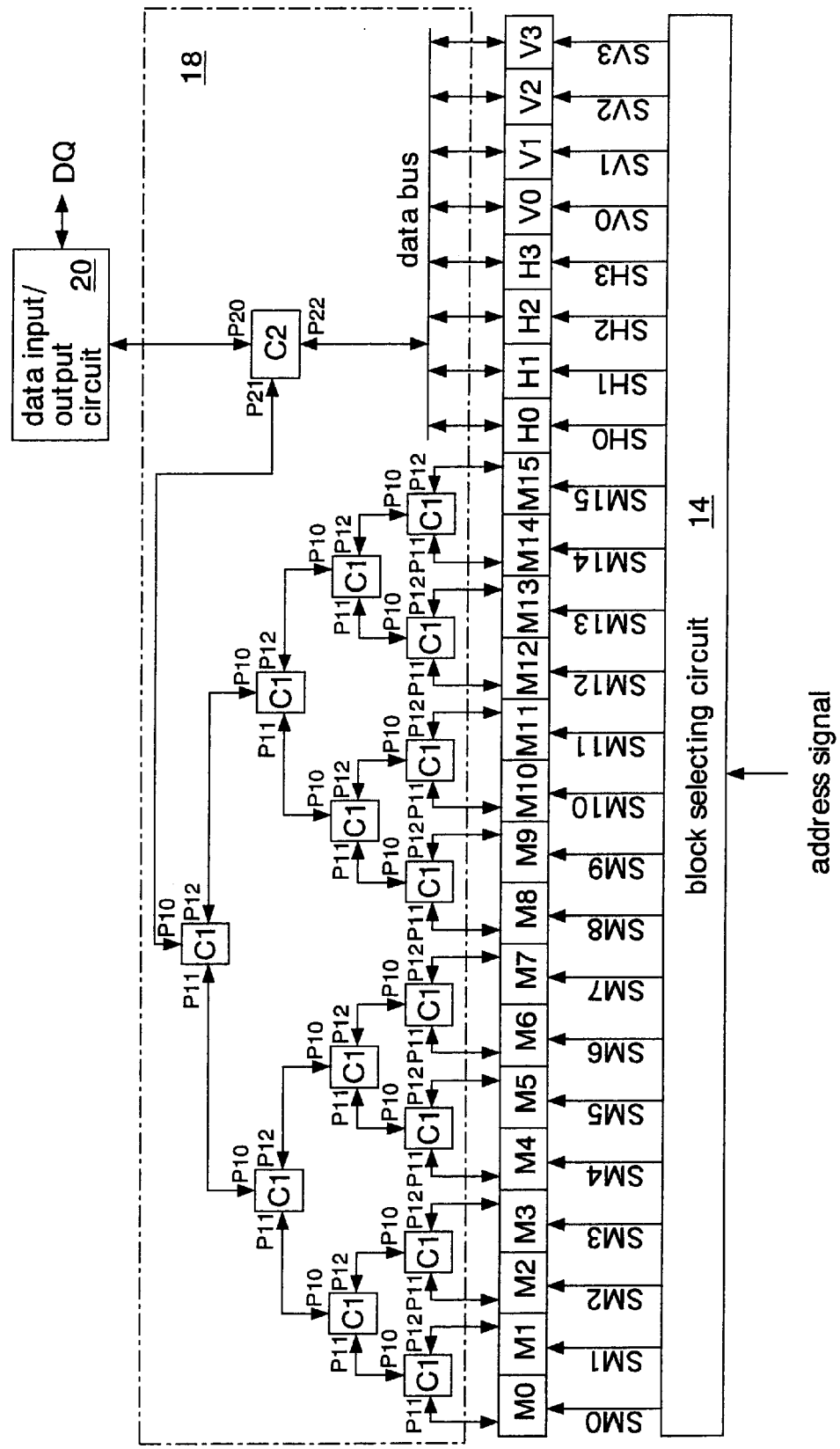
FIG. 9 is a block diagram showing the details of the switch circuit unit of FIG. 7.

FIG. 9 shows the details of the switch circuit unit 18.

The switch circuit unit 18 has a plurality of switch circuits C1 and a switch circuit C2. Each of the switch circuits C1 outputs the signal supplied at its input/output port P10 to either of its input/output ports P11 and P12, and outputs the exclusive OR of the signals supplied at the input/output ports P11 and P12 to the input/output port P10. Hereinafter, input/output ports will also be referred to simply as ports. The first memory blocks M0–M15 each are connected to any of the ports P11 and P12 of the switch circuits C1 that are shown to the bottom in the diagram. The ports P10 of the switch circuits C1 are connected to the ports P11 or P12 of the upper switch circuit(s) C1 successively. The port P10 of the switch circuit C1 shown at the top is connected to a port P21 of the switch circuit C2.

The switch circuit C2 outputs the signal supplied at its input/output port P20 to its input/output port P21, and outputs the exclusive OR of the signals supplied at the input/output ports P21 and P22 to the input/output port P20. Besides, the switch circuit C2 outputs the signal supplied at the port P21 to the port P22. The port P20 is connected to an input/output port of the data input/output circuit 20. The port P22 is connected to the second memory blocks H0–H3 and V0–V3 through a data bus for parity bits.

Figure 10:
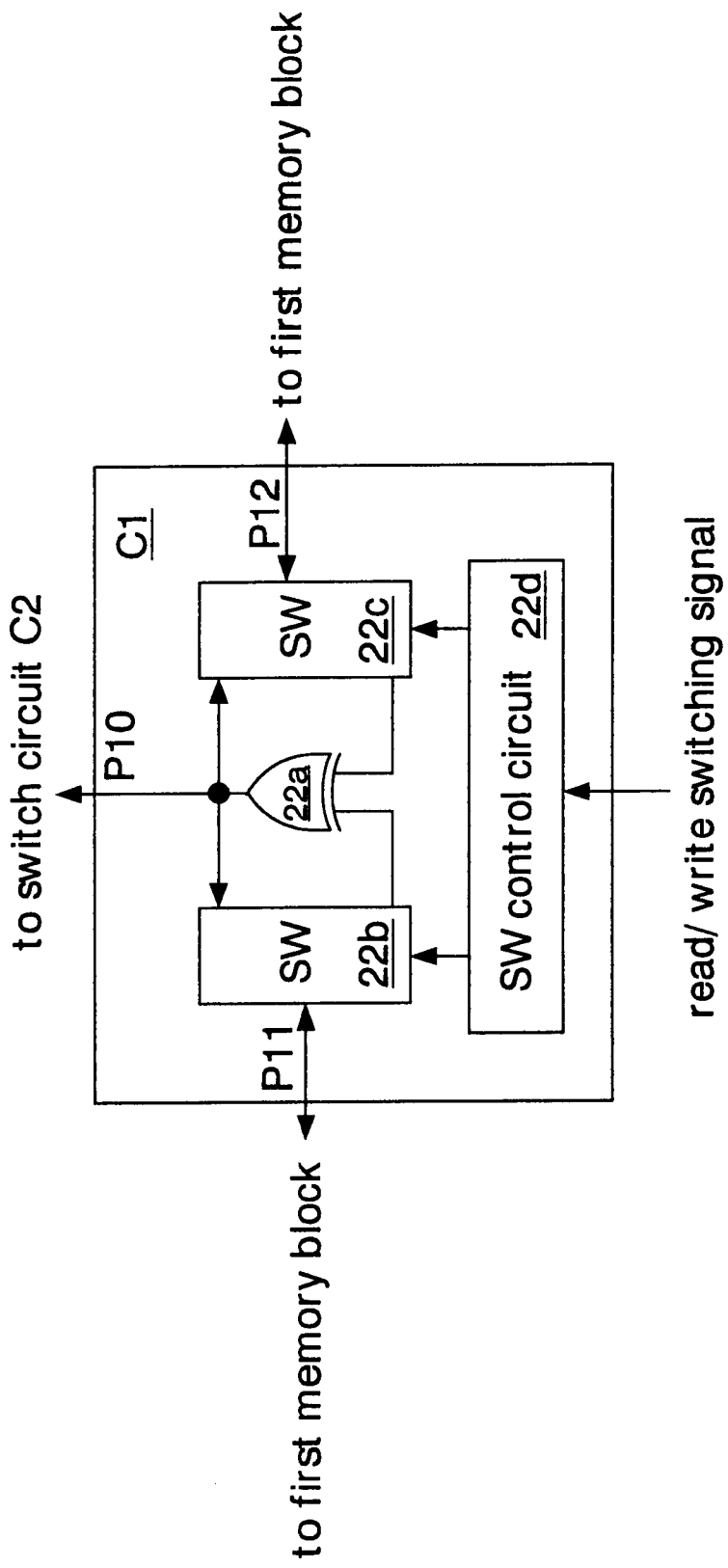
FIG. 10 is a block diagram showing the details of the switch circuits C1 of FIG. 9.

FIG. 10 shows the details of the switch circuits C1.

A switch circuit C1 includes an EOR circuit 22 having an output connected to the port P10, a switch 22b for connecting the port P11 to one input of the EOR circuit 22a or the port P10, a switch 22c for connecting the port P12 to the other input of the EOR circuit 22a or the port P10, and a switch control circuit 22d for controlling the switches 22a and 22b in accordance with a read/write switching signal.

In write operations, the switch control circuit 22d connects the port P10 to the port P11 or P12. In read operations (in the first and second operations), the switch control circuit 22d connects the ports P11 and P12 to the inputs of the EOR circuit 22a.

Figure 11:
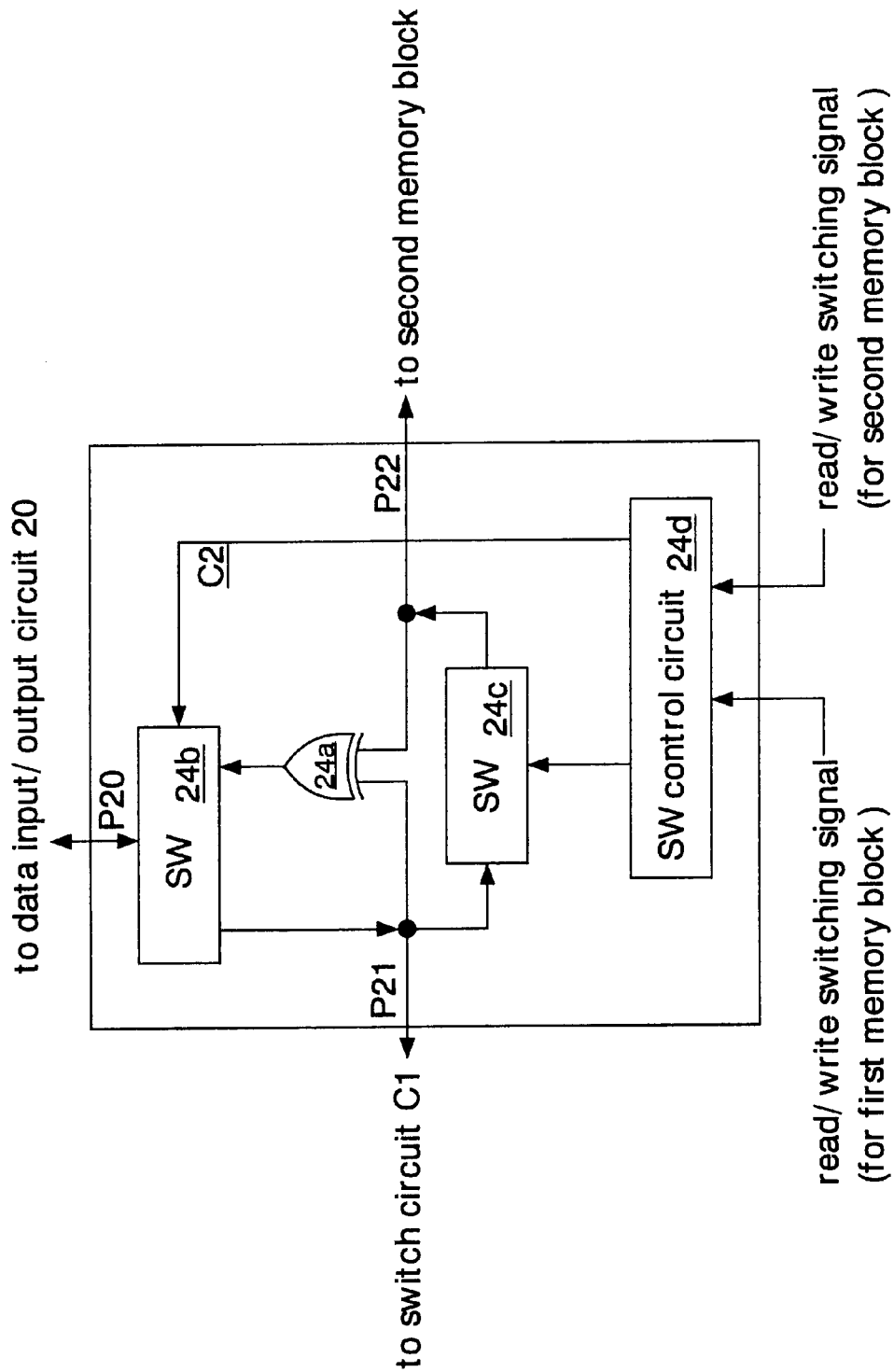
FIG. 11 is a block diagram showing the details of the switch circuit C2 of FIG. 9.

FIG. 11 shows the details of the switch circuit C2.

The switch circuit C2 includes an EOR circuit 24a, a switch 24b for connecting the port P20 to the port P21 or the output of the EOR circuit 24a, a switch 24c for connecting the port P21 directly to the port P22, and a switch control circuit 24d for controlling the switches 24b and 24c in accordance with a read/write switching signal for a first memory block and a read/write switching signal for a second memory block. The ports P21 and P22 are individually connected to the inputs of the EOR circuits 24a.

In write operations, the switch control circuit 24d connects the port P20 to the port P21 through the switch 24b (data write to a first memory block), and then connects the port P21 to the port P22 through the switch 24c (parity-bit write to a second memory block). In read operations (in the first and second operations), the switch control circuit 24d connects the output of the EOR circuit 24a to port P20 through the switch 24b.

Figure 12:
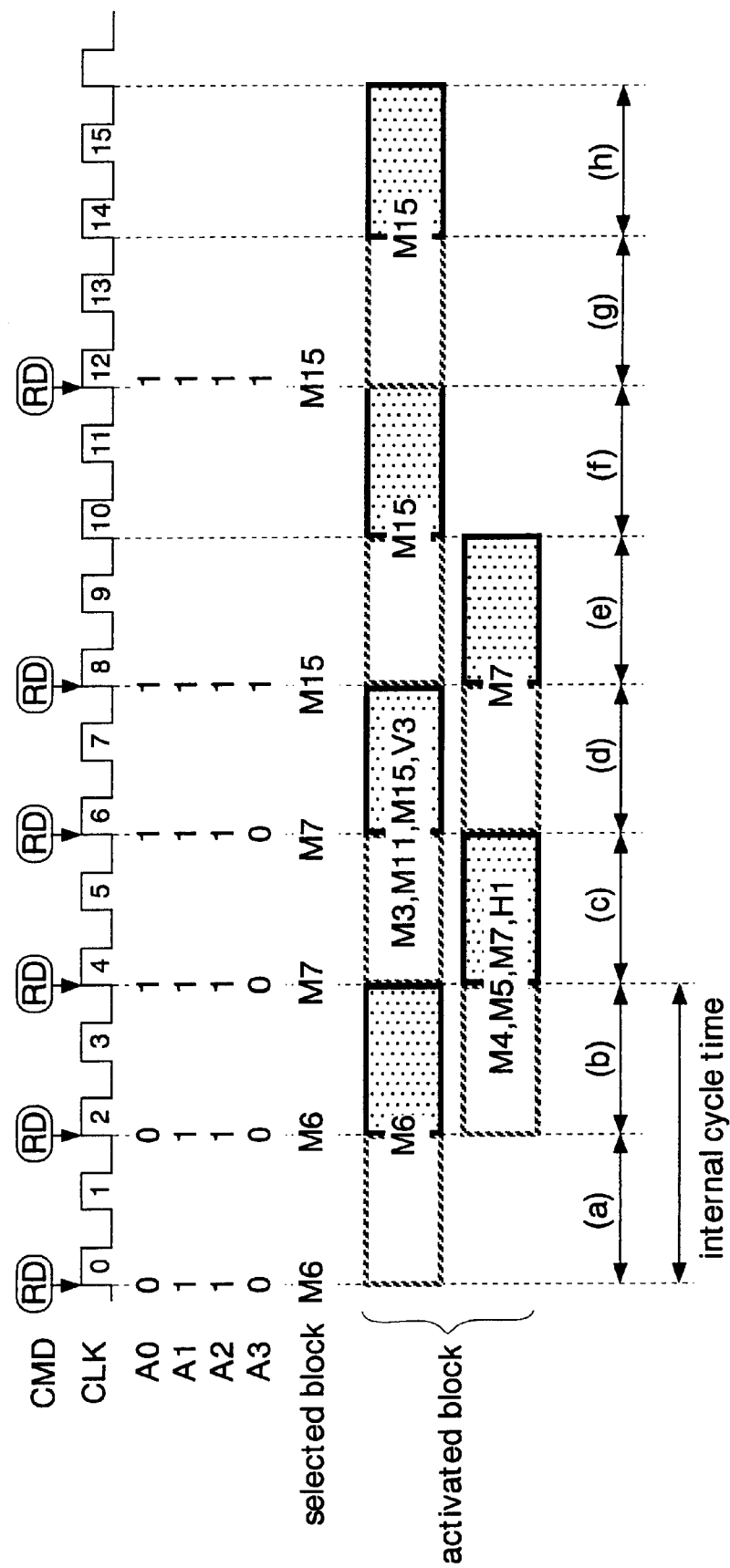
FIG. 12 is a timing chart showing read operations of the SDRAM in the second embodiment.

FIG. 12 shows read operations of the SDRAM described above.

In this example, two successive read operations are performed on the block M6 before two successive read operations are performed on the block M7, followed by two read operations on the block M15. As in FIG. 6 described above, thick broken lines in the diagram show the first halves of read operations, and shades the second halves of read operations. The interval of supply of read commands RD (external cycle time) is a half of the internal cycle time. Accordingly, at least either ones of the first operations and the second operations are performed in parallel.

(a) The SDRAM receives a read command RD and an address signal for accessing the block M6 in synchronization with a clock signal CLK. Upon the reception of the read command RD, the blocks M0–M15 are not in operation. The flag circuit unit 16 shown in FIG. 8 therefore keeps the flag signals FLM0–FLM15 inactivated. On this account, while the operation decision circuit 24 in the block selecting circuit 24 receives the select signal S6 from the decoder 22, it do not activate the operation signal OP6.

The second memory block selecting circuit 26 receives the inactivation of the operation signals OP0–OP15 to inactivate the block selecting signals SH0–SH3 and SV0–SV3. The first memory block selecting circuit 28 receives the inactivation of the operation signals OP0–OP15 and the inactivation of the block selecting signals SH0–SH3, SV0–SV3, and outputs the select signal S6 as the block selecting signal SM6. That is, only the block selecting signal SM6 is activated to start a first operation.

The flag circuit unit 16 sets the flag circuit FM6 in response to the activation of the block selecting signal SM6, thereby activating (setting) the flag signal FLM6. That is, the flag circuit FM6 changes the operating state of the first memory block M6 to "in operation." In this way, the flag circuits FM0–FM15, FH0–FH3, and FV0–FV3 are set in response to the output of the block selecting signals SM0–SM15, SH0–SH3, and SV0–SV3 corresponding to these flag circuits.

(b) In synchronization with the second clock signal CLK, the SDRAM receives a read command RD and an address signal for accessing the block M6. The operation decision circuit 24 of FIG. 8 receives the select signal S6 from the decoder 22 and the flag signal FLM6 from the flag circuit FM6, and activates the operation signal OP6.

The second memory block selecting circuit 26 receives the activation of the operation signal OP6, and activates the block selecting signal SH1 for operating the second memory block H1 which is included in the same memory block group GH1 (FIG. 7) as the first memory block M6 is. The first memory block selecting circuit 28 receives the activation of the select signal S6, the operation signal 0P6, and the block selecting signal SH1, and activates the block selecting signals SM4, SM5, and SM7 for operating the blocks M4, M5, and M7 out of the block-H1-including memory block group GH1, excepting the block M6.

As a result, the block selecting circuit 14 selects the blocks M4, M5, M7, and H1 (the memory block group GH1) to start a second operation in the same manner as in the basic principles described above. That is, among the four bits of address signal A0–A3 supplied from the exterior of the memory, the higher two bits A2 and A3 are used exclusively. In accordance with the activation of the block selecting signals SM4, SM5, SM7, and SH1, the flag circuit unit 16 activates the flag signals FLM4, FLM5, FLM7, and FLH1.

Figure 13:
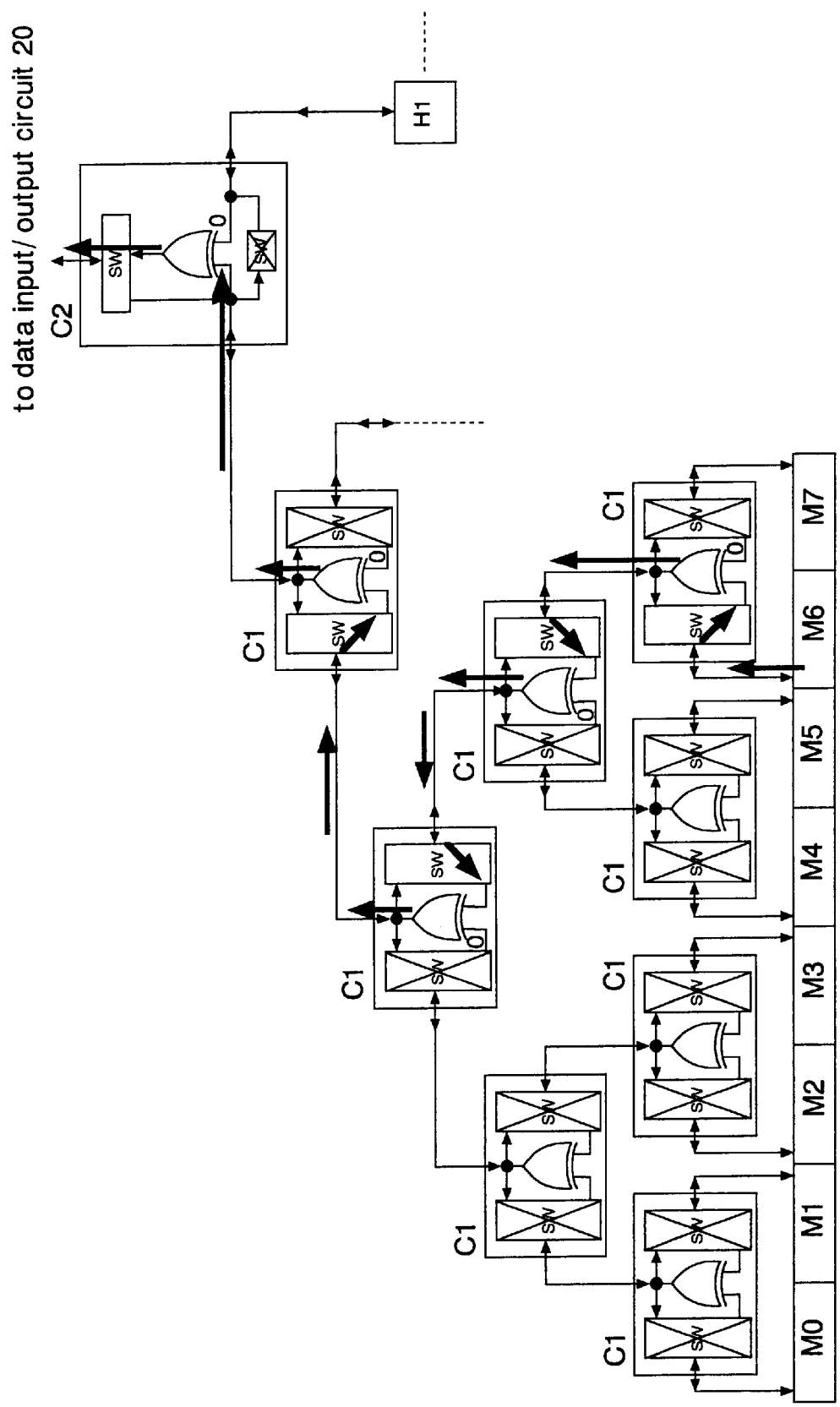
FIG. 13 is an explanatory diagram showing the operation of the switch circuit unit during a first operation of FIG. 12.

FIG. 13 shows the operation of the switch circuit unit 18 during the second half of the first operation on the block M6. The thick arrows in the diagram show data transmission paths. The switches marked with a cross are OFF. "0 data" is supplied to the inputs of the EOR circuits that are connected to the OFF switches. The data read from the block M6 is logically operated (exclusive-ORed) with "0 data" by a plurality of switch circuits C1, and is transmitted to the data input/output circuit 20 through the switch circuit C2. As a result, the read data is transmitted to the switch circuit C2 with no change in logic level.

The delay circuit 30 shown in FIG. 8 outputs the reset signal RESET6 in time with the completion of the first operation on the block M6. The flag circuit FM6 is reset in response to the reset signal RESET6, inactivating the flag signal FLM6. That is, the flag circuit FM6 changes the operating state of the first memory block M6 to "out of operation." In this way, the flag circuits FM0–FM15, FH0–FH3, and FV0–FV3 are reset in response to the lapse of a predetermined time after the activation of the block selecting signals SM0–SM15, SH0–SH3, and SV0–SV3 corresponding to these flag circuits.

(c) Next, in synchronization with the fourth clock signal CLK (FIG. 12), a read command RD and an address signal for accessing the block M7 are supplied. Upon the reception of the read command RD, the second operation on the block M6 is in execution. The flag circuit unit 16 shown in FIG. 8 has the flag signals FLM4, FLM5, FLM7, and FLH1 activated. On this account, the operation decision circuit 24 receives the select signal S7 from the decoder 22 to activate the operation signal OP7.

The second memory block selecting circuit 26 receives the activation of the operation signal OP7, and activates the block selecting signal SV3 for operating the second memory block V3 which is included in the same memory block group GV3 as the first memory block M7 is. The first memory block selecting circuit 28 receives the activation of the select signal S7, the operation signal OP7, and the block selecting signal SV3, and activates the block selecting signals SM3, SM11, and SM15 for operating the blocks M3, M11, and M15 excepting M7 in the memory group GV3 including the block M3.

As a result, the block selecting circuit 14 selects the blocks M3, M11, M15, and V3 (the memory block group GV3) to start a second operation. That is, among the four bits of address signal A0–A3 supplied from the exterior of the memory, the lower two bits A0 and A1 are used exclusively. In accordance with the activation of the block selecting signals SM3, SM11, SM15, and SV3, the flag circuit unit 16 activates the flag signals FLM3, FLM11, FLM15, and FLV3.

Figure 14:
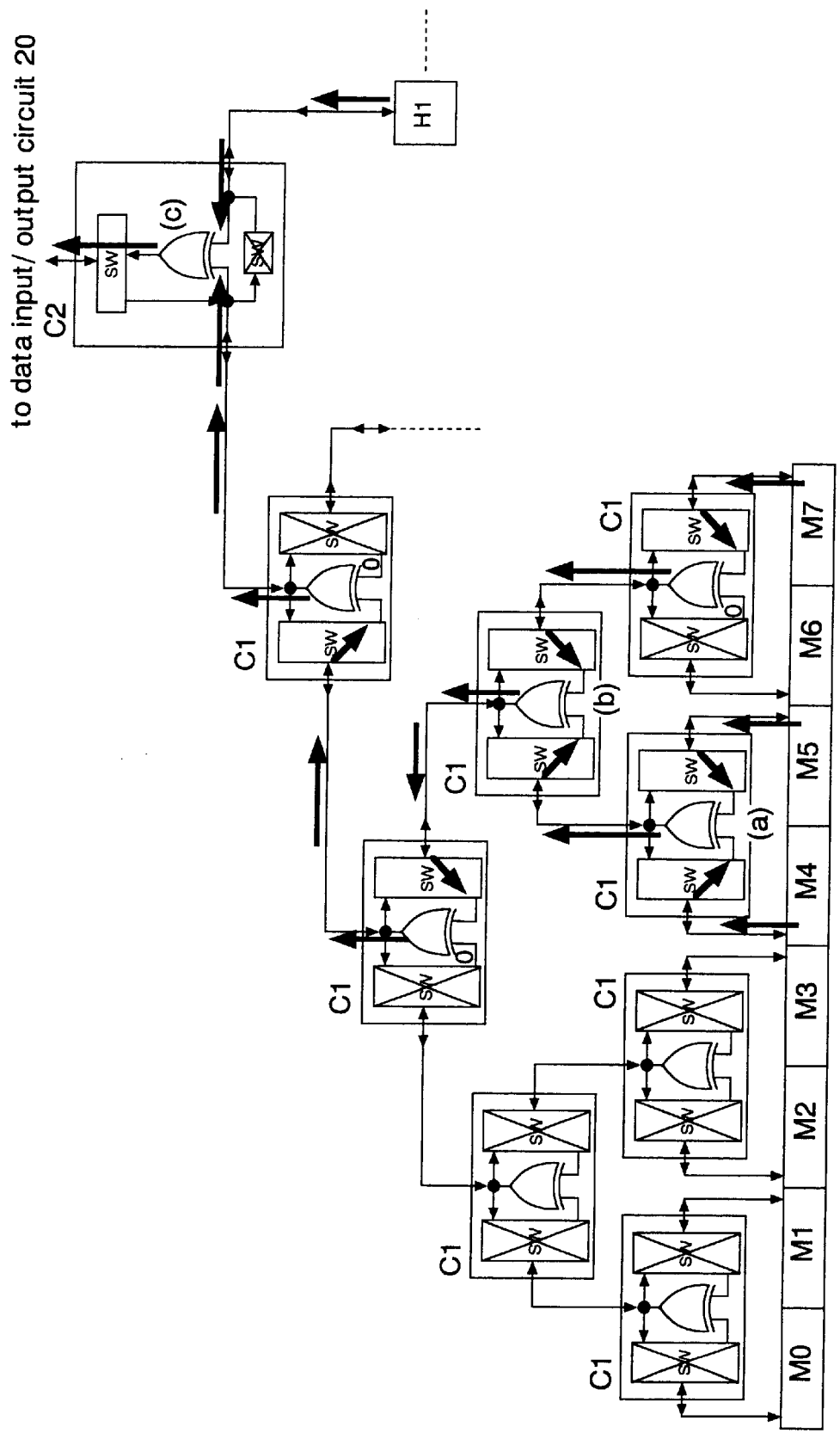
FIG. 14 is an explanatory diagram showing the operation of the switch circuit unit during a second operation of FIG. 12.
Figure 15:
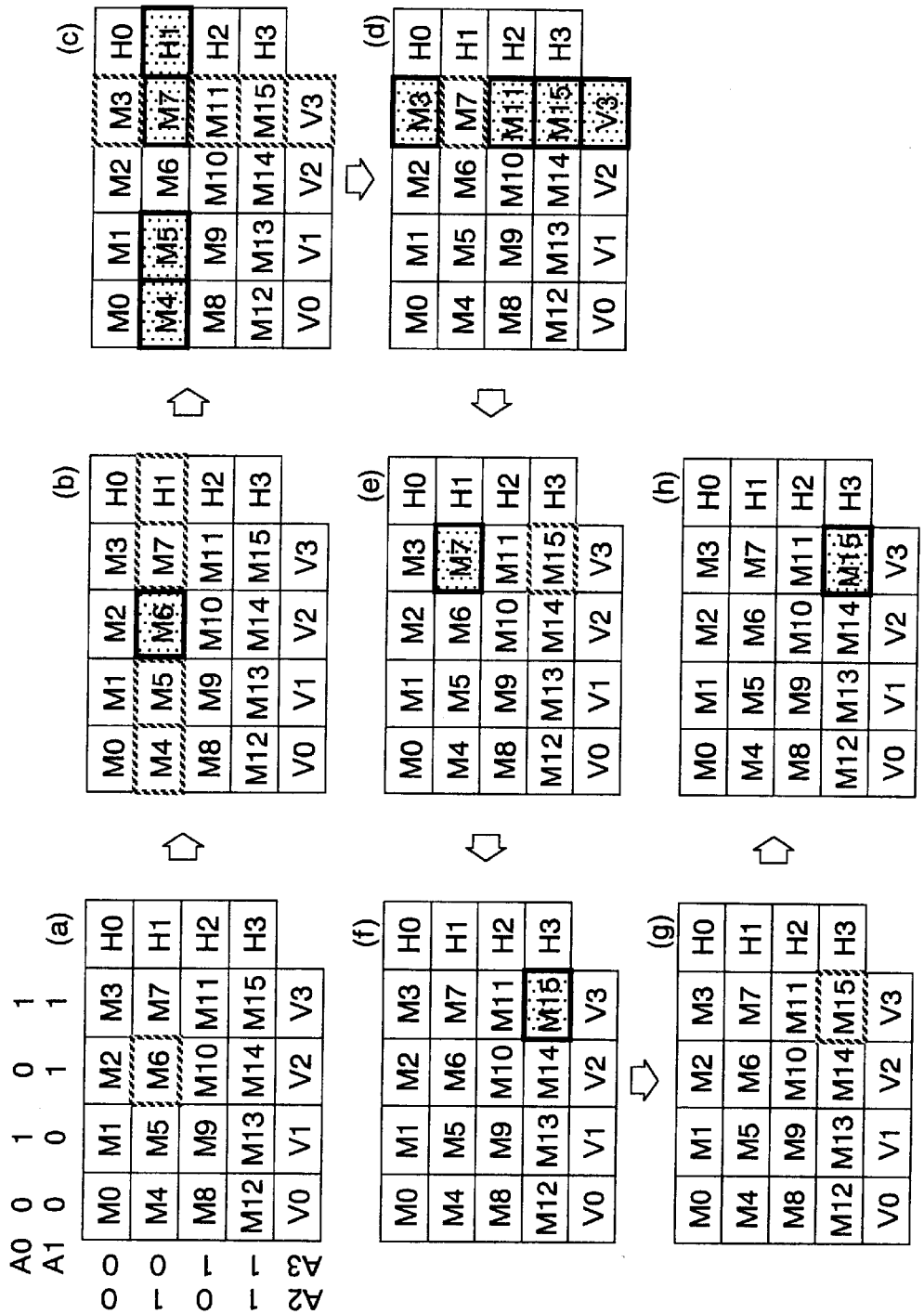
FIG. 15 is an explanatory diagram showing an overview of the read operations of FIG. 12.

FIG. 14 shows the operation of the switch circuit unit 18 during the second half of the second operation on the blocks M4, M5, M7, and H1. As in FIG. 13, "0 data" is supplied to the inputs of the EOR circuits that are connected to OFF switches. The pieces of data read from the blocks M4 and M5 are logically operated (exclusive-ORed) by the EOR circuit of a switch circuit C1 (FIG. 14(a)). The operation result is logically operated with the data read from the block M7, by the EOR circuit of another switch circuit C1 (FIG. 14(b)). This operation result is transmitted through switch circuits C1 for a further logical operation with the data read from the block H1 (FIG. 14(c)). Through these logical operations, the regeneration data of the block M6 is generated and transmitted to the data input/output circuit 20.

The delay circuit 30 shown in FIG. 8 outputs the reset signals RESET4, RESET5, RESET7, and RESETH1 in time with the completion of the second operation on the blocks M4, M5, M7, and H1. The flag circuit FM6 is reset in response to these reset signals, inactivating the flag signals FLM4, FLM5, FLM7, and FLH1.

(d) Next, in synchronization with the sixth clock signal CLK (FIG. 12), a read command RD and an address signal for accessing the block M7 are supplied. Since the block M7 has completed its operation, the read control circuit 14 selects the block M7 which is shown with thick broken lines, and starts a first operation in the same manner as in the foregoing (a). As in the foregoing (c), the SDRAM performs the second half of the second operation on the blocks M3, M11, M15, and V3 which are shown shaded, to output the read data.

(e) In synchronization with the eighth clock signal CLK, a read command RD and an address signal for accessing the block M15 are supplied. Since the block M15 is not in operation, the block selecting circuit 14 starts a first operation in the same manner as in the foregoing (a). As in the foregoing (b), the SDRAM also performs the second half of the first operation on the block M7 which is shown shaded, to output the read data.

(f) In synchronization with the tenth and eleventh clock signals, the second half of the first operation on the block M15 is performed.

(g) In synchronization with the twelfth clock signal CLK, a read command RD and an address signal for accessing the block M15 are supplied. Since the block M15 is not in operation, the block selecting circuit 14 starts a first operation in the same manner as in the foregoing (a).

(h) In synchronization with the fourteenth and fifteenth clock signals, the second half of the first operation on the block M15 is performed.

FIGS. 15(a)–(h) show an overview of the read operations shown in FIG. 12(a)–(h). The blocks indicated with thick broken lines are in the first halves of read operations, and those shaded the second halves of read operations.

Figure 16:
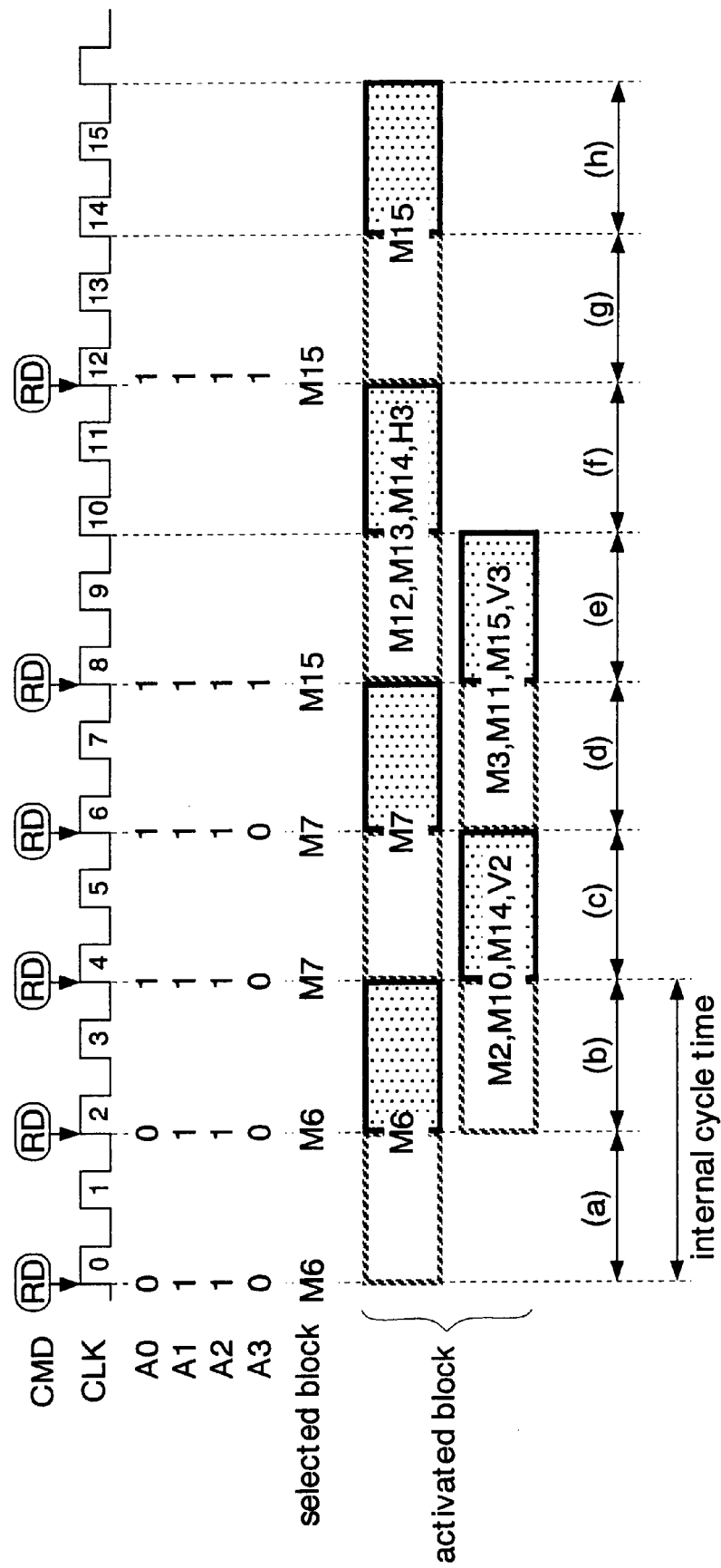
FIG. 16 is an explanatory diagram showing another example of control of read operations in the second embodiment.

FIG. 16 shows an example of read operations in which the second memory block selecting circuit 26 shown in FIG. 8 exercises different control.

In this example, the second memory block selecting circuit 26 activates the block selecting signal V2 instead of the block selecting signal H1 shown in FIG. 12, upon the read command RD in synchronization with the second clock signal CLK (read of the block M6). Here, read operations corresponding to the fourth, sixth, and eighth clock signals are performed as the first, second, and second operations, respectively.

Figure 17:
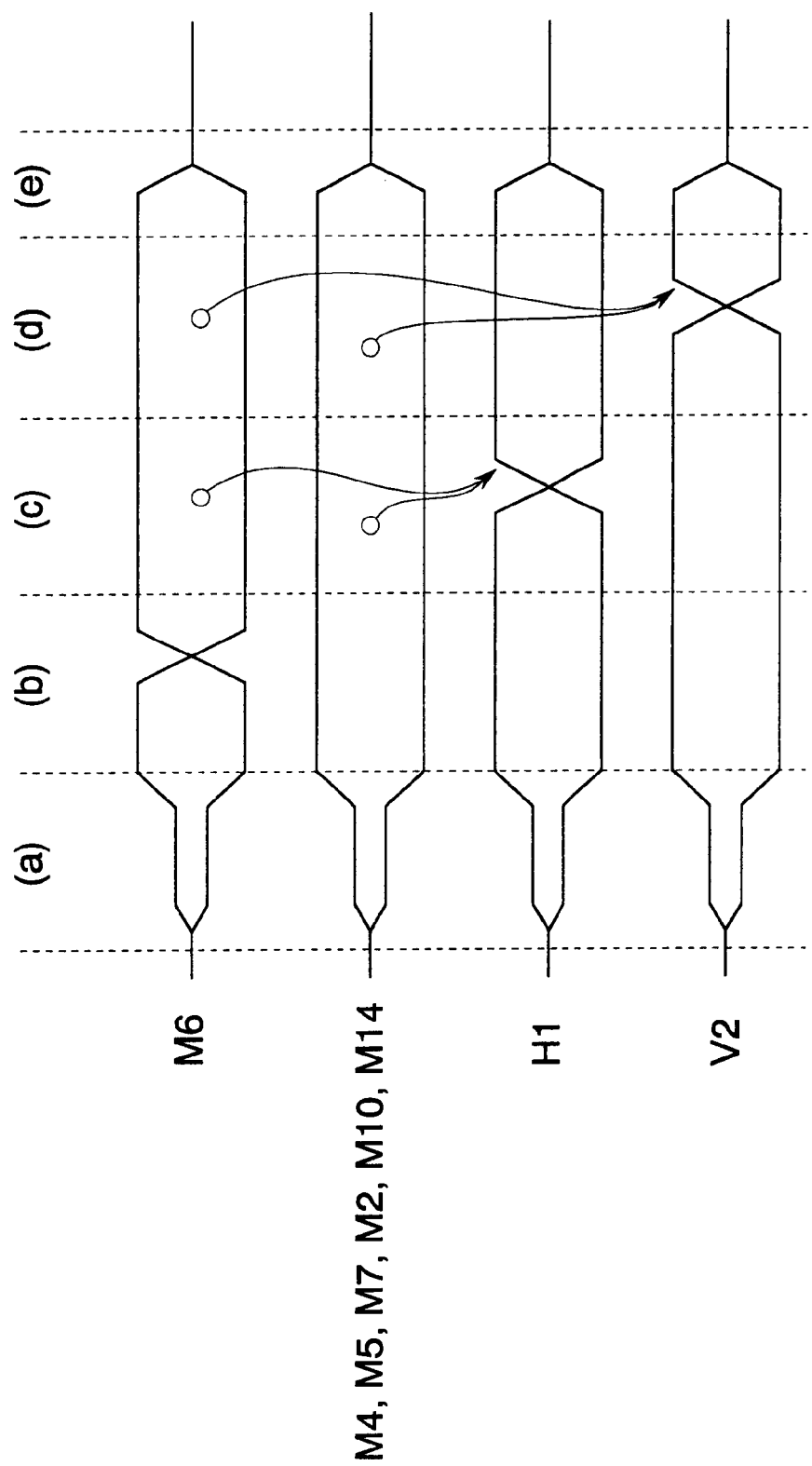
FIG. 17 is a timing chart showing an overview of a write operation of the SDRAM in the second embodiment.

FIG. 17 shows an overview of a write operation in the SDRAM.

In the case of writing data to the first memory block M6, all the blocks M4, M5, M6, M7, H1, M2, M10, M14, and V2 in the memory block groups GH1 and GV2 both including the block M6 are activated (FIG. 17(a)). Then, the write data is written to the block M6 (FIG. 17(b)).

Next, data is read from the blocks M4, M5, M6, and M7. The exclusive OR (parity bit) of the read data is written to the block H1 (FIG. 17(c)). Besides, data is read from the blocks M2, M6, M10, and M14, and the exclusive OR (parity bit) of the read data is written to the block V2 (FIG. 17(d)). Then, precharge operations are performed on the activated blocks M4, M5, M6, M7, H1, M2, M10, M14, and V2 to complete the write operation (FIG. 17(e)).

Figure 18:
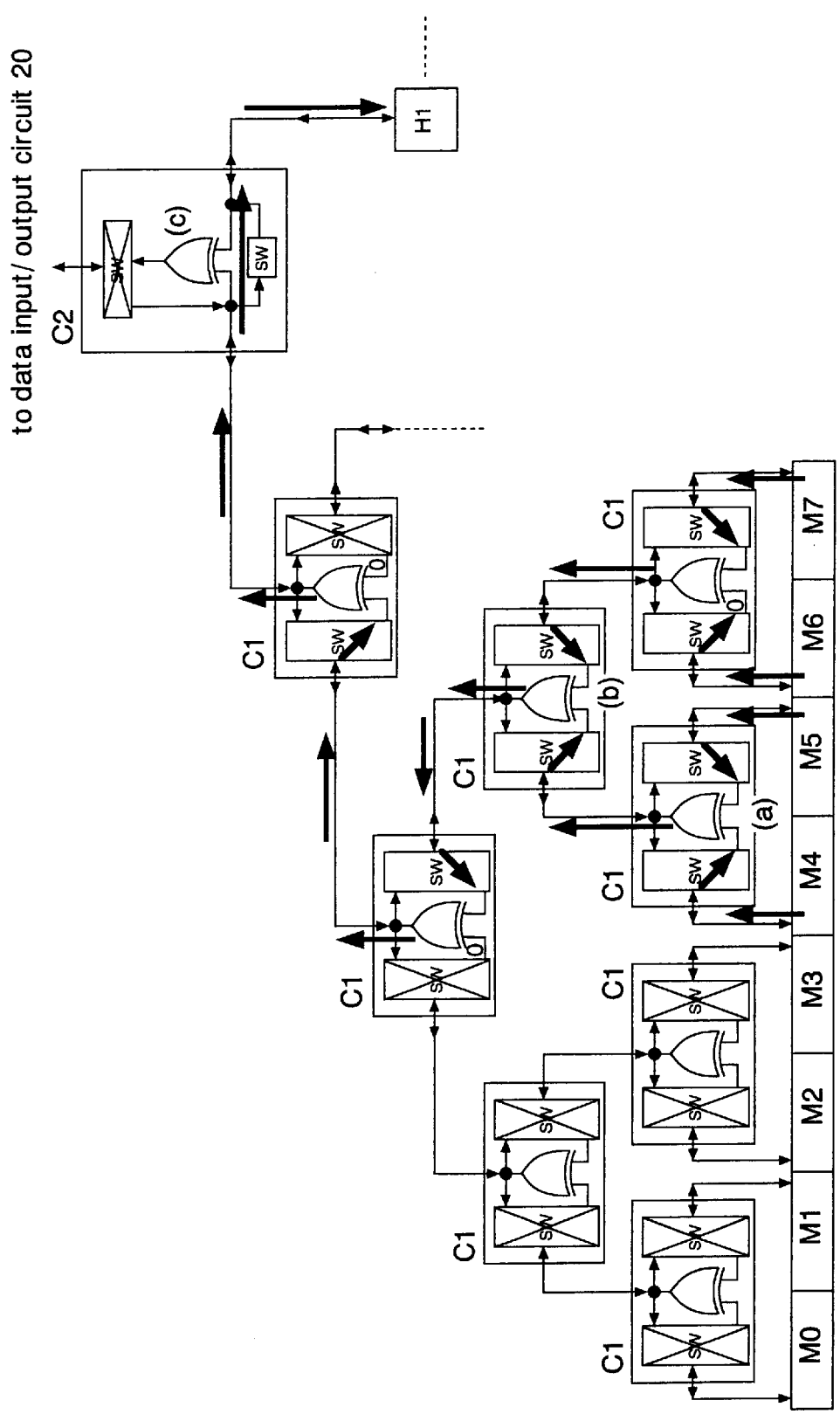
FIG. 18 is an explanatory diagram showing the operation of the switch circuit unit during a write operation of the SDRAM in the second embodiment.

FIG. 18 shows the operation of the switch circuit unit 18 (FIG. 9) when the parity bit is written to the block H1 in the above-described write operation. The thick arrows in the diagram show data transmission paths. The switches marked with a cross are OFF. "0 data" is supplied to the inputs of the EOR circuits that are connected to the OFF switches. Then, the exclusive OR (parity bit) of the data read from the blocks M4, M5, M6, and M7 is written to the block H1.

This embodiment can offer the same effects as those obtained from the basic principles and the first embodiment described above. Moreover, in this embodiment, each of the first memory blocks is assigned to a plurality of memory block groups so that a plurality of the first memory blocks belonging to one memory block group do not belong to another memory block group together. Specifically, the first memory blocks M0–M15 are arranged in a 4×4 matrix, and a plurality of first memory blocks aligning in a horizontal direction and a vertical direction are assigned to a second memory block each. This facilitates the configuration of the memory block groups GH0–GH3 and GV0–GV3. Since the first and second memory blocks M0–M15, H0–H3, and V0–V3 can be arranged by simple rules, the layout design becomes easier. Accordingly, the wiring that interconnects the first and second memory blocks M0–M15, H0–H3, and V0–V3 can be prevented from complication, allowing a reduction in the layout area necessary for the wiring. As a result, the SDRAM can be made smaller in chip size. Besides, a reduction in the wiring length mentioned above allows the first and second memory blocks M0–M15, H0–H3, and V0–V3 to be operated at higher speed.

The block selecting circuit 14 has only to select at least any of the first and second memory blocks M0–M15, H0–H3, V0–V3 in accordance with the flag signals FLM0–FLM15, FLH0–FLH3, FLV0–FLV3 output from the flag circuits FM0–FM15, FH0–FH3, FV0–FV3, and the address signal A0–A3. This allows a reduction in circuit scale.

Figure 19:
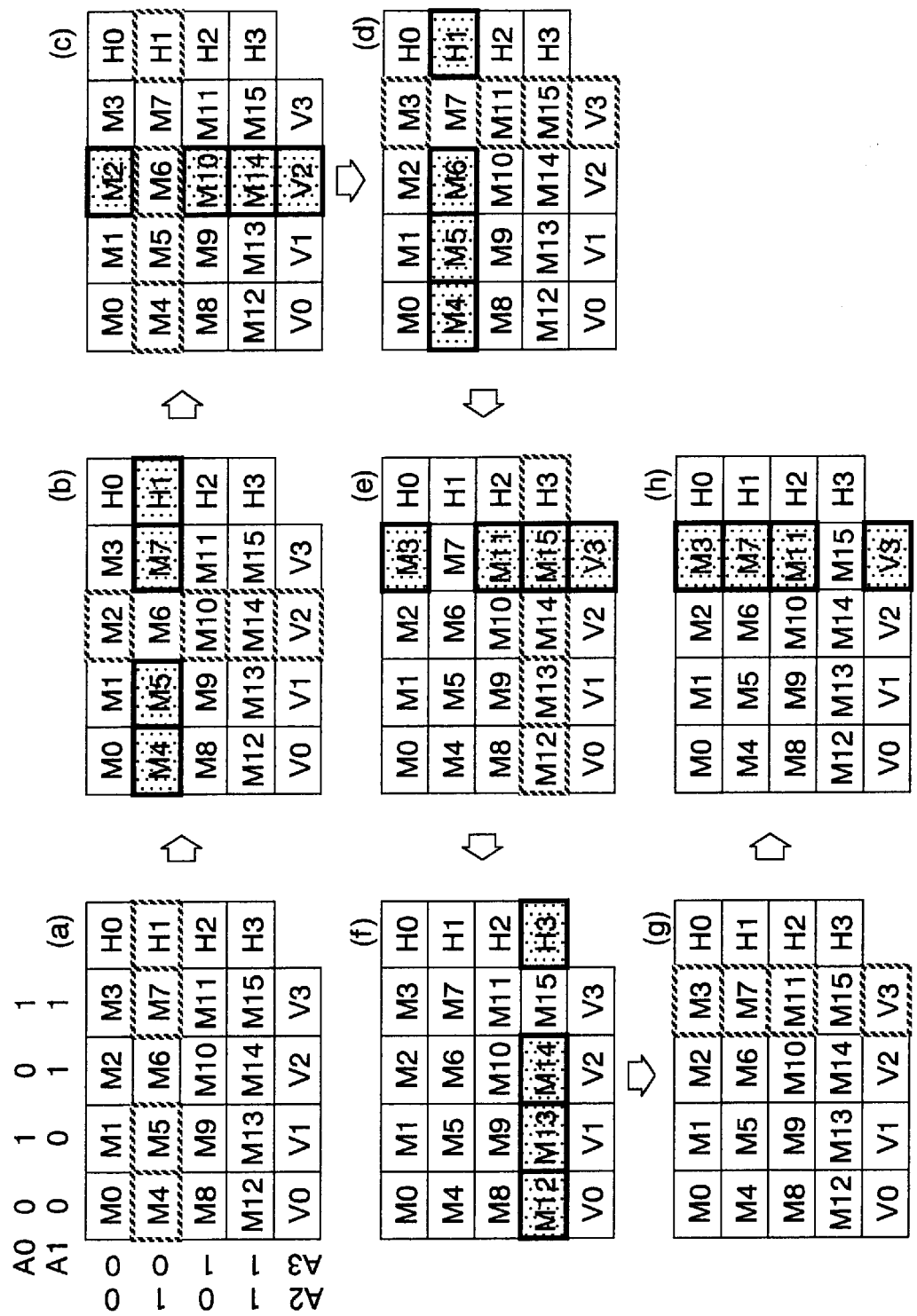
FIG. 19 is an explanatory diagram showing a third embodiment of the present invention.
Figure 20:
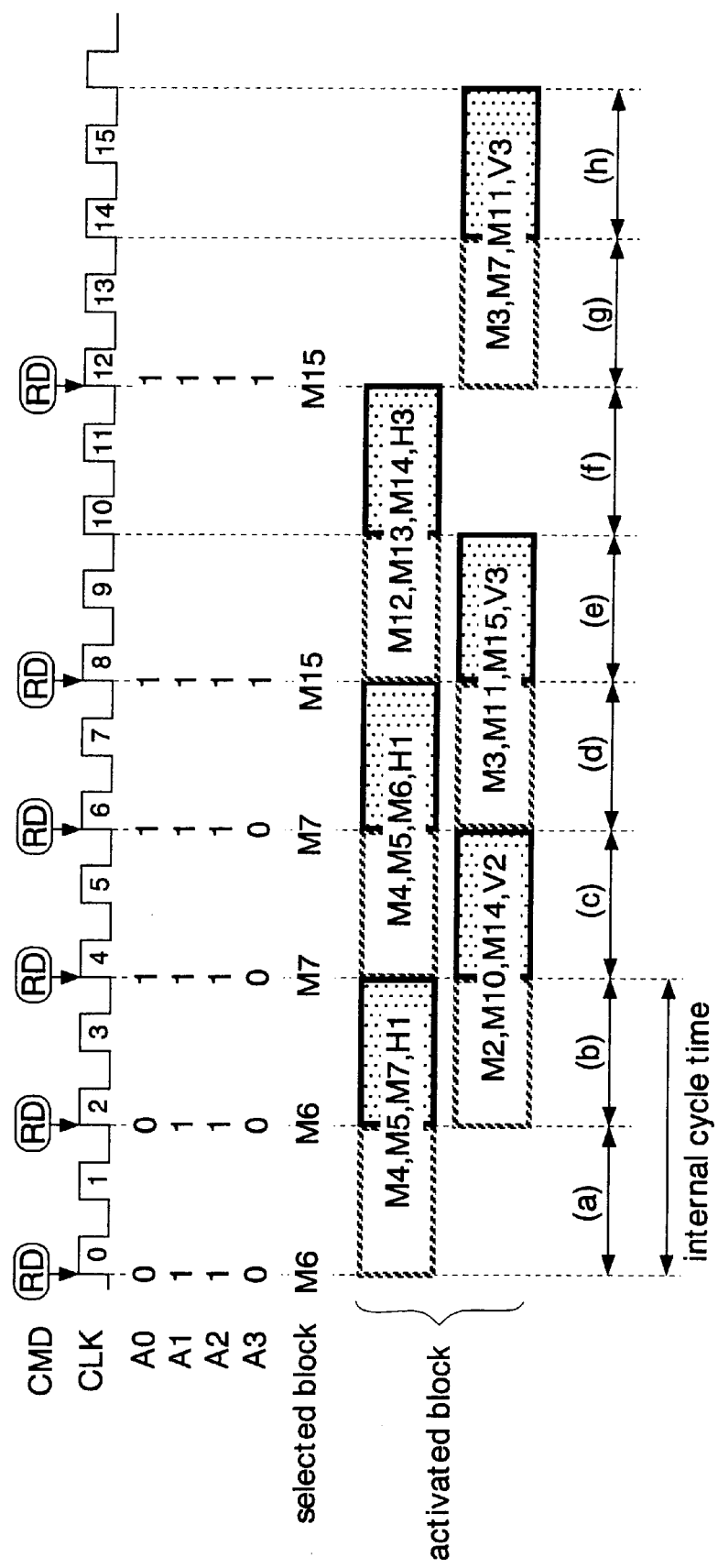
FIG. 20 is an explanatory diagram showing an overview of read operations in the third embodiment.

FIGS. 19 and 20 show a third embodiment of the present invention. The same elements as those of the basic principles and the second embodiment described above will be designated by identical reference numbers or symbols.

This semiconductor memory is formed as a clock synchronous DRAM (SDRAM). Like the second embodiment, the SDRAM has sixteen first memory blocks M0–M15 which are arranged in a 4×4 matrix and eight second memory blocks H0–H3 and V0–V3, as well as a not-shown block selecting circuit (read control circuit), data input/output circuit, and so on. This embodiment is characterized in that the SDRAM performs the second operations alone. Thus, the block selecting circuit will not make a decision which to perform, a first operation or a second operation.

FIGS. 19(a)–(h) and FIGS. 20(a)–(h) show operations corresponding to FIGS. 15(a)–(h) and FIGS. 12(a)–(h), respectively. That is, even in this example, two successive read operations (second operations) are performed on the block M6 before two successive read operations (second operations) are performed on the block M7, followed by two read operations (second operations) on the block M15. The interval of supply of read commands RD (external cycle time) is a half of the internal cycle time. Therefore, a plurality of second operation are performed in parallel.

Incidentally, this embodiment deals with the case where the second operation involving the second memory blocks H0–H3 and the second operation involving the second memory blocks V0–V3 are performed by turns. Nevertheless, a plurality of second operations involving, for example, the second memory blocks H0–H3 or the second memory block V0–V3 may be performed in succession.

This embodiment can offer the same effects as those obtained from the first embodiment described above. Moreover, in this embodiment, only the second operations are performed in read operations. This eliminates the need for the decision which to perform, a first operation or a second operation, so that the control circuitry can be configured simply. As a result, it is possible to reduce the semiconductor memory in chip size, with a reduction in fabrication cost.

Figure 21:
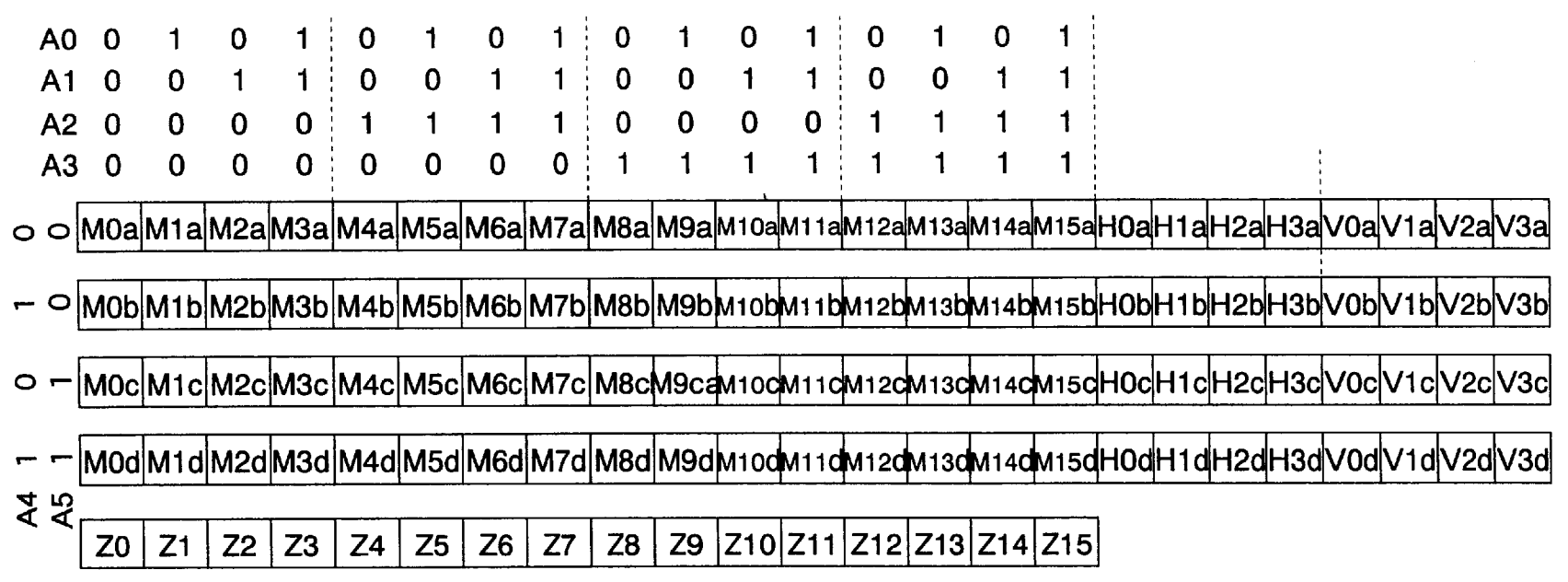

FIG. 21 shows a fourth embodiment of the present invention.

This semiconductor memory is formed as a clock synchronous DRAM (SDRAM). The SDRAM includes: 64 first memory blocks M0a–M15a, M0b–M15b, M0c–M15d, and M0d–M15d which are arranged in a 4×16 matrix; 48 second memory blocks H0a–H3a, H0b–H3b, H0c–H3c, H0d–H3d, V0a–V3a, V0b–V3b, V0c–V3c, V0d–V3d, and Z0–Z15; and a not-shown block selecting circuit (read control circuit), data input/output circuit, and so on. The first memory blocks are identified by six bits of address signal A0–A5 (block selecting address). Even in this embodiment, the SDRAM performs the second operations alone.

The second memory blocks with a leading "H" store the parity bits of four memory blocks having the same address signals A2–A5. The second memory blocks with a leading "V" store the parity bits of four memory blocks having the same address signals A0, A1, A4, and A5. The second memory blocks with a leading "Z" store the parity bits of four memory blocks having the same address signals A1–A3.

Then, each memory block group is composed of four first memory blocks having the same four bits of address signal and a second memory block group for storing the parity bit of these first memory blocks. Accordingly, each single first memory block belongs to three memory block groups. A plurality of the first memory blocks belonging to one memory block group do not belong to another memory block group together.

Figure 22:
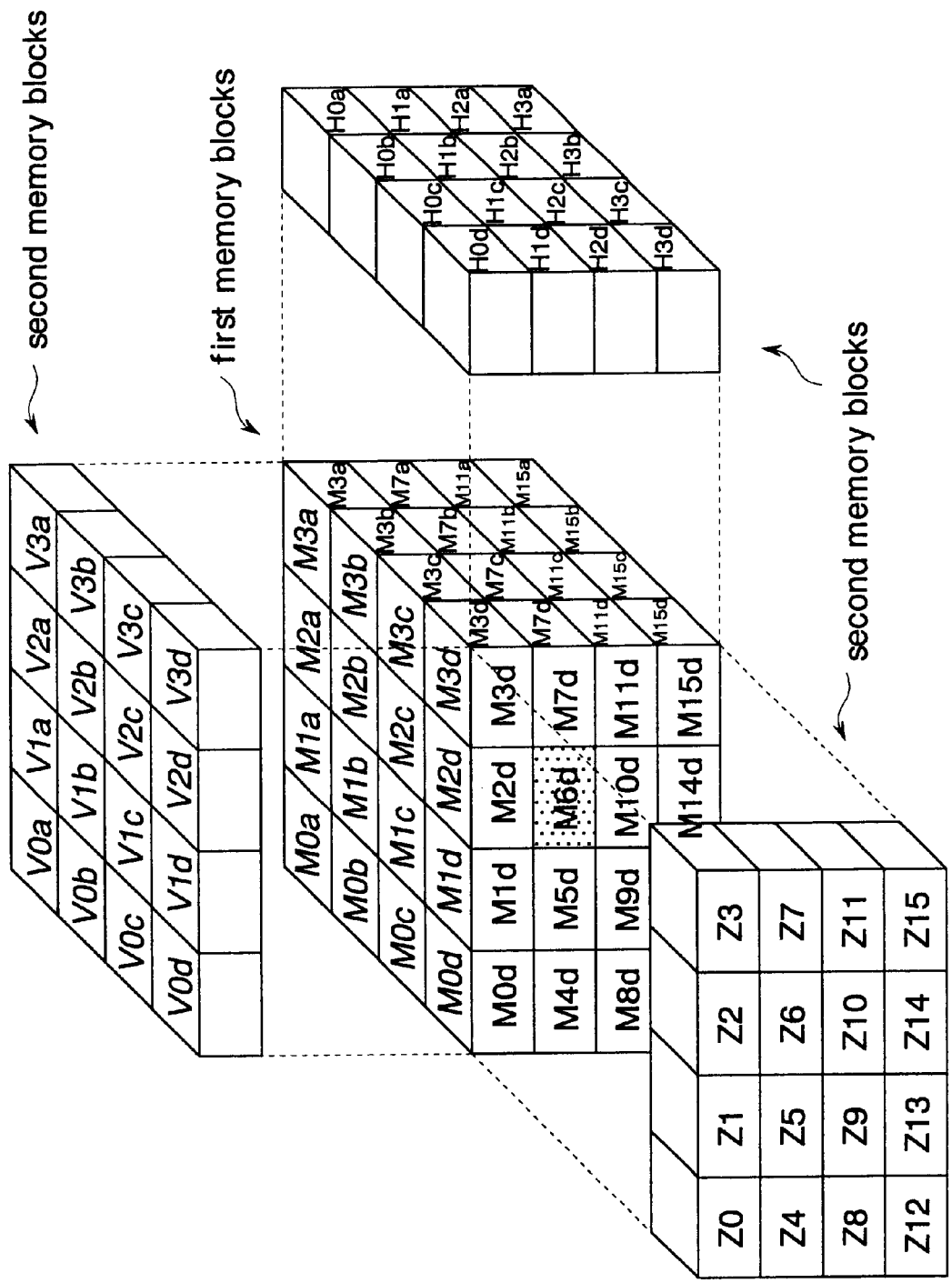
FIG. 22 is an explanatory diagram showing the relationship between the first and second memory blocks of FIG. 21.

FIG. 22 shows the relationship between the first and second memory blocks.

In this embodiment, first memory blocks of 4×4 configuration shown in FIG. 7 are stacked as much as four stages in the depth direction of the diagram. In this stack direction, the second memory blocks Z0–Z15 for storing parity bits are also arranged. Each single first memory block is included in three memory block groups that extend in three directions (memory block groups of three-dimensional configuration).

Figure 23:
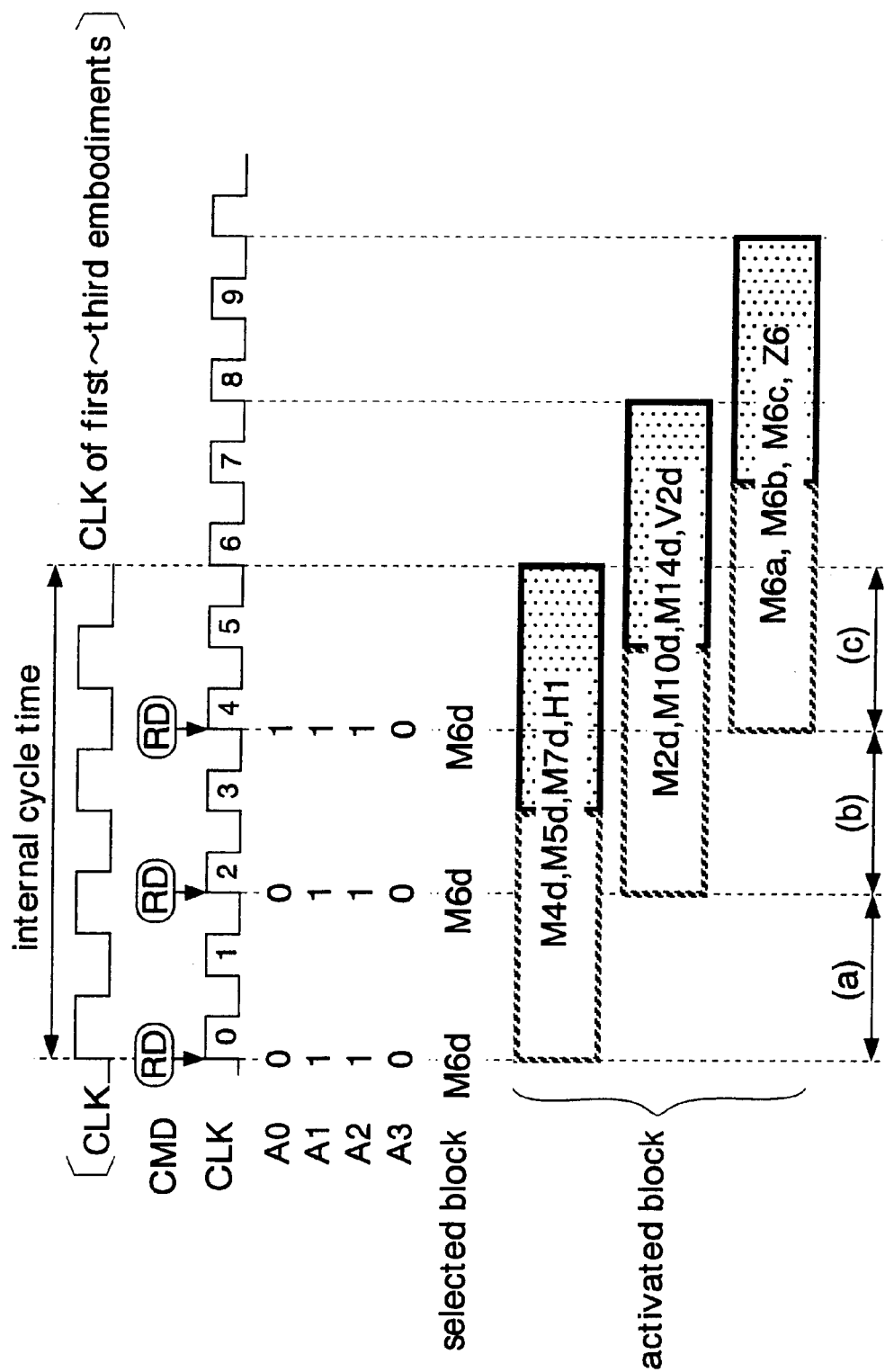
FIG. 23 is a timing chart showing read operations of the SDRAM in the fourth embodiment.

FIG. 23 shows read operations of the SDRAM described above. In this example, three successive read operations are performed on the block M6d which is shown shaded in FIG. 22. As in FIG. 6 described above, thick broken lines in the diagram show the first halves of read operations, and shades the second halves of read operations. The SDRAM of the present embodiment operates at a frequency 1.5 times that of the foregoing embodiments. For reference, the clock signal CLK of the foregoing embodiments is shown to the top in the diagram. Six cycles of clock signal CLK are the cycle time necessary for a read operation of the first and second memory blocks.

(a) Initially, a read command RD and an address signal for accessing the block M6d are supplied in synchronization with the clock signal CLK. The SDRAM activates the blocks M4d, MSd, M7d, and H1d to start a second operation.

(b) In synchronization with the second clock signal CLK, a read command RD and an address signal for accessing the block M6d are supplied. The SDRAM activates the blocks M2d, M10d, M14d, and V2d to start a second operation.

(c) In synchronization with the fourth clock signal CLK, a read command RD and an address signal for accessing the block M6d are supplied. The SDRAM activates the blocks M6c, M6b, M6a, and Z6 to start a second operation. That is, in this embodiment, three read commands can be accepted within the cycle time.

This embodiment can offer the same effects as those obtained from the embodiments described above.

Figure 24:
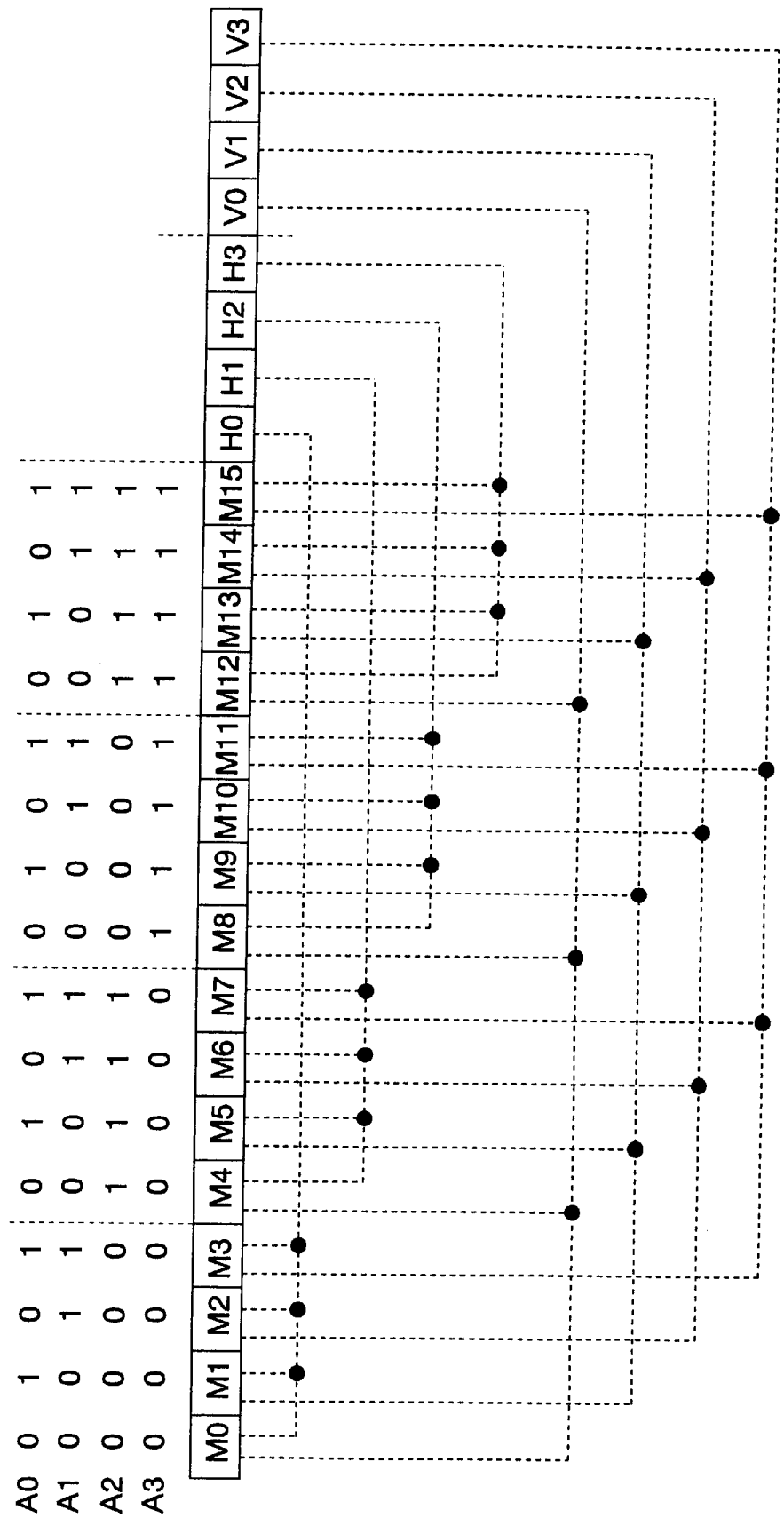
FIG. 24 is an explanatory diagram showing another example of arrangement of the first and second memory blocks in the second embodiment.

Incidentally, the second and third embodiments described above have dealt with the cases where the first memory blocks M0–M15 in a 4×4 matrix to constitute the two-dimensional memory block groups GH0–GH3 and GV0–GV3 which extend in two directions. However, the present invention is not limited to such embodiments. For example, as shown in FIG. 24, the first memory blocks M0–M15 and the second memory blocks H0–H3, V0–V3 may be arranged in a row with the memory block groups GH0–GH3 and GV0–GV3 configured as connected by the broken lines in the diagram. Even in this case, the memory block groups GH0–GH3 and GV0–GV3 are of two-dimensional configuration as in the second and third embodiments.

The embodiments described above have dealt with the cases where the memory block groups are in a two-dimensional configuration or a three-dimensional configuration. However, the present invention is not limited to such embodiments. For example, memory block groups may be configured in four or more dimensions. In this case, the external cycle time can be reduced further, with an improvement in data read rate.

The second embodiment described above has dealt with the case where the delay time of the delay circuit 30 is utilized to generate the reset signals RESET0–RESET15, RESETH0–RESETH3, and RESETV0–RESETV3 to reset the flag circuits FM0–FM15, FH0–FH3, and FV0–FV3. However, the present invention is not limited to such an embodiment. For example, the first and second memory blocks may output a signal for indicating the completion of an operation so that the flag signals FM0–FM15, FH0–FH3, and FV0–FV3 are reset by this signal.

The embodiments described above have dealt with the cases where the present invention is applied to an SDRAM. However, the present invention is not limited to such embodiments. For example, the present invention may be applied to SRAMs or clock asynchronous DRAMs. In particular, the present invention is effectively applied to volatile semiconductor memories. The present invention may also be applied to the cores of DRAMs or the like to be implemented on system LSIs.

The embodiments described above have dealt with the cases where the parity bits of the first memory blocks are stored into the second memory blocks. However, the present invention is not limited to such embodiments. For example, other error detection/error correction techniques dealt with in coding theories may be used so that the codes are stored into the second memory blocks.

The invention is not limited to the above embodiments and various modifications may be made without departing from the spirit and the scope of the invention. Any improvement may be made in part or all of the components.

What is claimed is:

1. A method of operation of a semiconductor memory comprising the steps of:

writing data to a first memory block selected from a plurality of first memory blocks and writing regeneration data for generating said data stored in said first memory block to a second memory block, in a write operation; and, performing either a first operation or a second operation for reading said data, according to whether the selected first memory block is in a read operation, said first operation for reading said data directly from the selected first memory block, said second operation for regenerating said data from other data stored in unselected first memory blocks and from said regeneration data stored in said second memory block, all of said first and second memory blocks being non-defective.

2. The method of operation of a semiconductor memory according to claim 1, wherein in performing said read operations in succession, only said second operations are sequentially performed to read said data.

3. The method of operation of a semiconductor memory according to claim 2, wherein said second operations are performed in parallel.

4. The method of operation of a semiconductor memory according to claim 1, wherein at least either said first operations or said second operations are performed in parallel.

5. The method of operation of a semiconductor memory according to claim 4, wherein requests for said read operations are received at an interval shorter than a read cycle necessary for performing said first or second operation once.

6. The method of operation of a semiconductor memory according to claim 1, wherein said regeneration data in said second memory block is a parity bit of said first memory blocks.

7. A semiconductor memory comprising:

a plurality of first memory blocks for storing data;

a second memory block for storing regeneration data for regenerating said data stored in said first memory blocks; and a read control circuit for performing either a first operation or a second operation for reading said data, according to whether a selected first memory block is in a read operation, said first operation for reading said data directly from the selected first memory block, said second operation for regenerating said data from other data stored in unselected first memory blocks and from said regeneration data stored in said second memory block, wherein all of said first and second memory blocks are non-defective in the read operation.

8. The semiconductor memory according to claim 7, wherein said read control circuit, in said read operations, performs only said second operations to read said data.

9. The semiconductor memory according to claim 8, wherein said read control circuit performs said second operations in parallel.

10. The semiconductor memory according to claim 7, wherein said read control circuit performs at least either said first operations or said second operations in parallel.

11. The semiconductor memory according to claim 10, wherein requests for said read operations are received at an interval shorter than a read cycle necessary for performing said first or second operation once.

12. The semiconductor memory according to claim 7, comprising a plurality of memory block groups each composed of a predetermined number of first memory blocks among said plurality of first memory blocks and any of a plurality of said second memory blocks, and wherein:

each of said first memory blocks belongs to said plurality of memory block groups; and a plurality of said first memory blocks belonging to one of said memory block groups does not belong to any other memory block groups together.

13. The semiconductor memory according to claim 12, wherein said read control circuit performs at least either said first operations or said second operations in parallel, on a plurality of said memory block groups to which one of said first memory blocks belongs.

14. The semiconductor memory according to claim 12, wherein said memory block groups are identified by an address signal, and addresses of said first memory blocks belonging to one of said memory block groups partly have the same bits in value.

15. The semiconductor memory according to claim 7, comprising:

a plurality of flag circuits for indicating that said first and second memory blocks are in operation, respectively; and a block selecting circuit for selecting at least either said first or second memory blocks in accordance with the outputs of said flag circuits, and an address signal.

16. The semiconductor memory according to claim 15, wherein said flag circuits indicate whether the memory blocks are in operation or not in operation in accordance with memory block selecting signals corresponding to said flag circuits, said memory block selecting signals being output from said block selecting circuit.

17. The semiconductor memory according to claim 16, wherein said flag circuits indicate that the memory blocks are in operation in response to the output of said memory block selecting signals corresponding to said flag circuits, and indicate that the memory blocks are not in operation after a predetermined time after the output of the corresponding memory block selecting signals.

18. The semiconductor memory according to claim 7, wherein
said regeneration data in said second memory block is a parity bit of said first memory blocks.

19. A method of operation of a semiconductor memory comprising the steps of:
writing data to a first memory block selected from a plurality of first memory blocks and writing regeneration data for regenerating data stored in said first memory block to a second memory block, in a write operation; and
performing a second operation for reading said data when the selected first memory block is in a first operation and another first operation cannot be performed, said first operation for reading said data directly from the selected first memory block, said second operation for regenerating said data from other data stored in unselected first memory blocks and from said regeneration data stored in said second memory block.

20. A method of operation of a semiconductor memory comprising the steps of:
writing data to a first memory block selected from a plurality of first memory blocks and writing regeneration data for regenerating data stored in said first memory block to a second memory block, in a write operation; and
performing only second operations instead of first operations for reading said data when read operations are to be repeatedly performed for a non-defective first memory block each of said first operations for reading said data directly from each of selected first memory bocks, each of said second operations for regenerating said data from other data stored in unselected first memory blocks and from said regeneration data stored in said second memory block.

21. A semiconductor memory comprising:
a plurality of first memory blocks for storing data;
a second memory block for storing regeneration data for regenerating said data stored in said first memory blocks; and
a read control circuit for performing a second operation for reading said data when a selected first memory block is in a first operation, and another first operation cannot be performed, said first operation for reading said data directly from the selected first memory block, said second operation for regenerating said data from other data stored in unselected first memory blocks and from said regeneration data stored in said second memory block.

22. A semiconductor memory comprising:
a plurality of first memory blocks for storing data;
a second memory block for storing regeneration data for regenerating said data stored in said first memory blocks; and
a read control circuit for performing only second operations instead of first operations for reading said data when read operations are to be repeatedly performed for a non-defective first memory block each of said first operations for reading said data directly from each of selected first memory blocks, each of said second operations for regenerating said data from other data stored in unselected first memory blocks and from said regeneration data stored in said second memory.

* * * * *